United States Patent
Kanda et al.

(10) Patent No.: US 6,968,516 B2
(45) Date of Patent: Nov. 22, 2005

(54) LSI DEVELOPMENT SUPPORT SYSTEM

(75) Inventors: Shinobu Kanda, Osaka (JP); Yoji Okabe, Kyoto (JP); Tsutomu Mikami, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 135 days.

(21) Appl. No.: 10/633,038

(22) Filed: Aug. 4, 2003

(65) Prior Publication Data

US 2004/0123250 A1    Jun. 24, 2004

(30) Foreign Application Priority Data

Dec. 18, 2002  (JP) .............................. 2002-366511

(51) Int. Cl.[7] ............................................. G06F 17/50
(52) U.S. Cl. .................... 716/1; 715/511; 715/964; 707/102; 707/201
(58) Field of Search .................... 716/1, 3, 18; 700/97, 700/103, 121; 707/102, 201; 715/511, 964

(56) References Cited

U.S. PATENT DOCUMENTS

| | | | | |
|---|---|---|---|---|
| 5,754,441 A | * | 5/1998 | Tokunoh et al. | 716/11 |
| 6,304,790 B1 | * | 10/2001 | Nakamura et al. | 700/97 |
| 6,449,762 B1 | * | 9/2002 | McElvain | 716/18 |
| 6,513,143 B1 | * | 1/2003 | Bloom et al. | 716/3 |
| 6,591,403 B1 | * | 7/2003 | Bass et al. | 716/5 |
| 6,810,508 B1 | * | 10/2004 | Bloom et al. | 716/4 |
| 2002/0032493 A1 | * | 3/2002 | Kadowaki et al. | 700/97 |

FOREIGN PATENT DOCUMENTS

JP     05-101054      4/1993

* cited by examiner

*Primary Examiner*—Stacy A. Whitmore
(74) *Attorney, Agent, or Firm*—McDermott Will & Emery LLP

(57) ABSTRACT

Information on a plurality of IPs (intellectual properties) serving as LSI design assets is stored in a registered-IP database, from which IP-based operation manual data, specification data and design data are extracted, and each converted and synthesized according to common individual detailed specifics (product-type-based detailed specifics). The individual detailed specifics can be prepared by filling in blanks in a detailed-specific template extracted from the registered-IP database.

10 Claims, 28 Drawing Sheets

IP1 = J710M0_PORT
INSTANCE = XXXX
a: DETAILED SPECIFICS 1
b: MANUAL 1
c: SPECIFICATION 1
d: DESIGN 1

| PORTn | PnOUT ADDRESS MSB...LSB | PnIN ADDRESS MSB...LSB | PnDIR ADDRESS MSB...LSB | PnPLU ADDRESS MSB...LSB |
|---|---|---|---|---|
| 0 | | | | |
| | | | | |
| 1 | | | | |
| | | | | |

| REGISTER NAME | DESCRIPTIONS (WITH PnDIR) | DESCRIPTIONS (WITHOUT PnDIR) |
|---|---|---|
| PnOUT | TO OUTPUT DATA TO A TERMINAL, SET THE CONTROL FLAG OF THE DIRECTION CONTROL REGISTER (PnDIR) FOR THE PORT n TO 1 AND WRITE THE DATA ON THE OUTPUT REGISTER (PnOUT) FOR THE PORT n. | TO OUTPUT DATA TO A TERMINAL, WRITE THE DATA ON THE OUTPUT REGISTER (PnOUT) FOR THE PORT n. |
| PnIN | TO READ THE DATA INPUTTED TO THE TERMINAL, SET THE CONTROL FLAG OF THE DIRECTION CONTROL REGISTER (PnDIR) FOR THE PORT n TO 0 AND READ OUT THE VALUE OF THE INPUT REGISTER (PnIN) FOR THE PORT n. | TO READ THE DATA INPUTTED TO THE TERMINAL, READ OUT THE VALUE OF THE INPUT REGISTER (PnIN) FOR THE PORT n. |
| PnDIR | IN THE PORT n, INPUT/OUTPUT DIRECTIONS CAN BE CONTROLLED ON A BIT-BY-BIT BASIS BY THE DIRECTION CONTROL REGISTER (PnDIR) FOR THE PORT n. WHEN THE CONTROL FLAG OF THE DIRECTION CONTROL REGISTER (PnDIR) FOR THE PORT n INDICATES 1, AN OUTPUT MODE RESULTS, AND WHEN THE CONTROL FLAG INDICATES 0, AN INPUT MODE RESULTS. | — |
| PnPLU | IN THE PORT n, PRESENCE OR ABSENCE OF A PULL-UP RESISTOR CAN BE SELECTED ON A BIT-BY-BIT BASIS BY THE PULL-UP RESISTOR CONTROL REGISTER (PnPLU) FOR THE PORT n. WHEN THE CONTROL FLAG OF THE PULL-UP RESISTOR CONTROL REGISTER (PnPLU) OF THE PORT n IS SET TO 1, A PULL-UP RESISTOR IS ADDED. | = |

| Pnm | | | | | | |
|---|---|---|---|---|---|---|
| INPUT VOLTAGE HIGH LEVEL | $V_{IH}$ | | $0.8V_{DD}$ | | $V_{DD}$ | V |
| INPUT VOLTAGE LOW LEVEL | $V_{IL}$ | | $V_{SS}$ | | $0.2V_{DD}$ | V |
| PULL-UP RESISTOR | $R_{IH}$ | WITH PULL-UP RESISTOR $V_{IN}=1.2$ V | 36 | 90 | 180 | kΩ |
| INPUT LEAKAGE CURRENT | $I_{LI}$ | WITHOUT PULL-UP RESISTOR $V_{IN}=0 \sim V_{DD}$ | | | ±2 | μA |
| OUTPUT VOLTAGE HIGH LEVEL | $V_{OH}$ | $I_{OH}=-300$ μA | 2.4 | | | V |
| OUTPUT VOLTAGE LOW LEVEL | $V_{OL}$ | $I_{OL}=1.6$ mA | | | 0.6 | V |

| MODULE FROM WHICH WIRING STARTS | | | MODULE TO WHICH WIRING EXTENDS | | |
|---|---|---|---|---|---|
| MODULE | INSTANCE | TERMINAL | MODULE | INSTANCE | TERMINAL |
| J710MO_PORT |  | p0out0 |  |  |  |
| J710MO_PORT |  | p0dir0 | J710MO_PORT |  | p0in0 |
| J710MO_PORT |  | p0plu0 |  |  |  |
| J710MO_PORT |  | p1out7 |  |  |  |
| J710MO_PORT |  | p1dir7 | J710MO_PORT |  | p1in7 |
| J710MO_PORT |  | p1plu7 |  |  |  |

IP2=J20211_AM13
  INSTANCE=     CPU
    a:DETAILED SPECIFICS 2
    b:MANUAL 2
    c:SPECIFICATION 2
    d:DESIGN2

IP3=J71051_IRQ
  INSTANCE=IRQ
    a:DETAILED SPECIFICS3
    b:MANUAL3
    c:SPECIFICATION 3
    d:DESIGN3

IP1=J710M0_PORT
  INSTANCE=PORT
    a:DETAILED SPECIFICS1
    b:MANUAL1
    c:SPECIFICATION 1
    d:DESIGN1

IP4=J710D0_TM8
  INSTANCE=TM8
    a:DETAILED SPECIFICS4
    b:MANUAL4
    c:SPECIFICATION 4
    d:DESIGN4

| PORTn | PnOUT ADDRESS MSB...LSB | PnIN ADDRESS MSB...LSB | PnDIR ADDRESS MSB...LSB | PnPLU ADDRESS MSB...LSB |
|---|---|---|---|---|
| 0 | 3F10 01111111 | 3F20 01111111 | 3F30 01111111 | 3F40 01111111 |
| 1 | 3F11 00011111 | 3F21 00011111 | NOT | 3F41 00011111 |

\<section\>\<heading\>DESCRIPTIONS FOR PORT 0 \</heading\>

\<section position ="square"\>

\<heading\>SETTING OF GENERAL-PURPOSE PORT\</heading\>

> \<para\>TO OUTPUT DATA TO A TERMINAL, SET THE CONTROL FLAG OF THE DIRECTION CONTROL REGISTER (P0DIR) FOR THE PORT 0 TO 1 AND WRITE THE DATA ON THE OUTPUT REGISTER (P0OUT) FOR THE PORT 0.\</para\>

> \<para\>TO READ THE DATA INPUTTED TO THE TERMINAL, SET THE CONTROL FLAG OF THE DIRECTION CONTROL REGISTER (P0DIR) FOR THE PORT 0 TO 0 AND READ OUT THE VALUE OF THE INPUT REGISTER (P0IN) FOR THE PORT 0.\</para\>

> \<para\>IN THE PORT 0, INPUT/OUTPUT DIRECTIONS CAN BE CONTROLLED ON A BIT-BY-BIT BASIS BY THE DIRECTION CONTROL REGISTER (P0DIR) FOR THE PORT 0. WHEN THE CONTROL FLAG OF THE DIRECTION CONTROL REGISTER (P0DIR) FOR THE PORT 0 INDICATES 1, AN OUTPUT MODE RESULTS, AND WHEN THE CONTROL FLAG INDICATES 0, AN INPUT MODE RESULTS.\</para\>

> \<para\>IN THE PORT 0, PRESENCE OR ABSENCE OF A PULL-UP RESISTOR CAN BE SELECTED ON A BIT-BY-BIT BASIS BY THE PULL-UP RESISTOR CONTROL REGISTER (P0PLU) FOR THE PORT 0. WHEN THE CONTROL FLAG OF THE PULL-UP RESISTOR CONTROL REGISTER (P0PLU) OF THE PORT 0 IS SET TO 1, A PULL-UP RESISTOR IS ADDED.\</para\>

\</section\> \</section\>

\<section\>\<heading\>DESCRIPTIONS FOR PORT 1\</heading\>

\<section position ="square"\>

\<heading\>SETTING OF GENERAL-PURPOSE PORT\</heading\>

> \<para\>TO OUTPUT DATA TO A TERMINAL, WRITE THE DATA ON THE OUTPUT REGISTER (P1OUT) FOR THE PORT 1.\</para\>

> \<para\>TO READ THE DATA INPUTTED TO THE TERMINAL, READ OUT THE VALUE OF THE INPUT REGISTER (P1IN) FOR THE PORT 1.\</para\>

> \<para\>IN THE PORT 1, PRESENCE OR ABSENCE OF A PULL-UP RESISTOR CAN BE SELECTED ON A BIT-BY-BIT BASIS BY THE PULL-UP RESISTOR CONTROL REGISTER (P1PLU) FOR THE PORT 1. WHEN THE CONTROL FLAG OF THE PULL-UP RESISTOR CONTROL REGISTER (P1PLU) OF THE PORT 1 IS SET TO 1, A PULL-UP RESISTOR IS ADDED.\</para\>

\</section\>\</section\>

| | | | | | |
|---|---|---|---|---|---|
| INPUT VOLTAGE HIGH LEVEL | $V_{IH}$ | | $0.8V_{DD}$ | | $V_{DD}$ | V |
| INPUT VOLTAGE LOW LEVEL | $V_{IL}$ | | $V_{SS}$ | | $0.2V_{DD}$ | V |
| PULL-UP RESISTOR | $R_{IH}$ | WITH PULL-UP RESISTOR $V_{IN}=1.2$ V | 36 | 90 | 180 | kΩ |
| INPUT LEAKAGE CURRENT | $I_{LI}$ | WITHOUT PULL-UP RESISTOR $V_{IN}=0 \sim V_{DD}$ | | | ±2 | μA |
| OUTPUT VOLTAGE HIGH LEVEL | $V_{OH}$ | $I_{OH}=-300$ μA | 2.4 | | | V |
| OUTPUT VOLTAGE LOW LEVEL | $V_{OL}$ | $I_{OL}=1.6$ mA | | | 0.6 | V |

P01

| | | | | | |
|---|---|---|---|---|---|
| INPUT VOLTAGE HIGH LEVEL | $V_{IH}$ | | $0.8V_{DD}$ | | $V_{DD}$ | V |
| INPUT VOLTAGE LOW LEVEL | $V_{IL}$ | | $V_{SS}$ | | $0.2V_{DD}$ | V |
| PULL-UP RESISTOR | $R_{IH}$ | WITH PULL-UP RESISTOR $V_{IN}=1.2$ V | 36 | 90 | 180 | kΩ |
| INPUT LEAKAGE CURRENT | $I_{LI}$ | WITHOUT PULL-UP RESISTOR $V_{IN}=0 \sim V_{DD}$ | | | ±2 | μA |
| OUTPUT VOLTAGE HIGH LEVEL | $V_{OH}$ | $I_{OH}=-300$ μA | 2.4 | | | V |
| OUTPUT VOLTAGE LOW LEVEL | $V_{OL}$ | $I_{OL}=1.6$ mA | | | 0.6 | V |

| MODULE FROM WHICH WIRING STARTS | | | MODULE TO WHICH WIRING EXTENDS | | |
|---|---|---|---|---|---|
| MODULE | INSTANCE | TERMINAL | MODULE | INSTANCE | TERMINAL |
| J710M0_PORT | PORT | p0out0 | iobuf | p00io | out |
| iobuf | p00io | in | J710M0_PORT | PORT | p0in0 |
| J710M0_PORT | PORT | p0dir0 | iobuf | p00io | dir |
| J710M0_PORT | PORT | p0plu0 | iobuf | p00io | plu |
| J710M0_PORT | PORT | p1out7 | open | open | open |
| iobuf | FIX | 0 | J710M0_PORT | PORT | p1in7 |
| J710M0_PORT | PORT | p1dir7 | open | open | open |
| J710M0_PORT | PORT | p1plu7 | open | open | open |

FIG. 17

4.1 FUNCTIONS OF PORT 0

4.1.1 DESCRIPTIONS FOR PORT 0

■ SETTING OF GENERAL-PURPOSE PORT
TO OUTPUT DATA TO A TERMINAL, SET THE CONTROL FLAG OF THE DIRECTION CONTROL REGISTER (P0DIR) FOR THE PORT 0 TO 1 AND WRITE THE DATA ON THE OUTPUT REGISTER (P0OUT) FOR THE PORT 0.

TO READ THE DATA INPUTTED TO THE TERMINAL, SET THE CONTROL FLAG OF THE DIRECTION CONTROL REGISTER (P0DIR) FOR THE PORT 0 TO 0 AND READ OUT THE VALUE OF THE INPUT REGISTER (P0IN) FOR THE PORT 0.

IN THE PORT 0, INPUT/OUTPUT DIRECTIONS CAN BE CONTROLLED ON A BIT-BY-BIT BASIS BY THE DIRECTION CONTROL REGISTER (P0DIR) FOR THE PORT 0. WHEN THE CONTROL FLAG OF THE DIRECTION CONTROL REGISTER (P0DIR) FOR THE PORT 0 INDICATES 1, AN OUTPUT MODE RESULTS, AND WHEN THE CONTROL FLAG INDICATES 0, AN INPUT MODE RESULTS.

IN THE PORT 0, PRESENCE OR ABSENCE OF A PULL-UP RESISTOR CAN BE SELECTED ON A BIT-BY-BIT BASIS BY THE PULL-UP RESISTOR CONTROL REGISTER (P0PLU) FOR THE PORT 0. WHEN THE CONTROL FLAG OF THE PULL-UP RESISTOR CONTROL REGISTER (P0PLU) OF THE PORT 0 IS SET TO 1, A PULL-UP RESISTOR IS ADDED.

| PRODUCT SPECIFICATION | | MN1234567 | | | | |
|---|---|---|---|---|---|---|
| | | ALL PAGES IN SPECIFICATION – PAGE 10 | | | | |
| C. ELECTRIC CHARACTERISTICS | | $T_a=-40°C \sim +85°C$ $V_{DD}=3V$ $V_{SS}=0V$ | | | | |
| ITEM | ABBREVI- ATION | CONDITION | ALLOWABLE VALUE | | | UNIT |
| | | | MIN- IMUM | STAND- ARD | MAX- IMUM | |
| P00 | | | | | | |
| INPUT VOLTAGE HIGH LEVEL | $V_{IH}$ | | $0.8V_{DD}$ | | $V_{DD}$ | V |
| INPUT VOLTAGE LOW LEVEL | $V_{IL}$ | | $V_{SS}$ | | $0.2V_{DD}$ | V |
| PULL-UP RESISTOR | $R_{IH}$ | WITH PULL-UP RESISTOR $V_{IN}=1.2V$ | 36 | 90 | 180 | kΩ |
| INPUT LEAKAGE CURRENT | $I_{LI}$ | WITHOUT PULL-UP RESISTOR $V_{IN}=0 \sim V_{DD}$ | | | ±2 | μA |
| OUTPUT VOLTAGE HIGH LEVEL | $V_{OH}$ | $I_{OH}=-300 \mu A$ | 2.4 | | | V |
| OUTPUT VOLTAGE LOW LEVEL | $V_{OL}$ | $I_{OL}=1.6 mA$ | | | 0.6 | V |

```
module SAMPLE (
P00,
  :
  :
P17);

input     P00;
  :
  :
input     P17;

wire      p00io_in_net0;
  :
  :
wire      p17io_in_net7;
wire      PORT_p0dir0_net8;
wire      PORT_p0out0_net9;
wire      PORT_p0plu0_net10;
  :
  :
wire      PORT_p1dir7_net53;
wire      PORT_p1out7_net54;
wire      PORT_p1plu7_net55;

iobuf p00io (
.io(P00),
.in(p00io_in_net0),
.dir(PORT_p0dir0_net8),
.out(PORT_p0out0_net9),
.plu(PORT_p0plu0_net10));
  :
  :
```

900

| IP MANAGEMENT DATA | VERSION |
|---|---|
| IP1 | Ver 1 |
| IP2 | Ver 2 |
| IP3 | Ver 2 |
| IP4 | Ver 3 |

FIG. 29

902  BEFORE CORRECTIONS

|  | LOCATION INFOR- MATION1 | LOCATION INFOR- MATION2 | LOCATION INFOR- MATION3 | LOCATION INFOR- MATION4 |
|---|---|---|---|---|
| INSET 1 | A1 ( 2, 3 ) | A2 ( 2, 9 ) | A3 ( 7, 9 ) | A4 ( 7, 3 ) |
| INSET 2 | B1 ( 5, 8 ) | B2 ( 5, 14 ) | B3 ( 10, 14 ) | B4 ( 10, 8 ) |

FIG. 30

902  AFTER CORRECTIONS

|  | LOCATION INFOR- MATION1 | LOCATION INFOR- MATION2 | LOCATION INFOR- MATION3 | LOCATION INFOR- MATION4 |
|---|---|---|---|---|
| INSET 1 | A1 ( 2, 3 ) | A2 ( 2, 9 ) | A3 ( 7, 9 ) | A4 ( 7, 3 ) |
| INSET 2 | B1 ( 5, 11 ) | B2 ( 5, 17 ) | B3 ( 10, 17) | B4 ( 10, 11 ) |

LSI DEVELOPMENT SUPPORT SYSTEM

BACKGROUND OF THE INVENTION

The present invention relates to an LSI development support system for generating design data for an LSI (large scale integrated circuit) and documents therefor such as an operation manual and a product specification.

There has been a known technique for enhancing efficiency in document preparation by dividing documents into their components for storage in a database and extracting and synthesizing some of the stored components for preparation of a document. In the known document preparation supporting system, a document is established by extracting document components requested by the user from a database and synthesizing those extracted components. The document is then laid out in a given format and the result is outputted (see Japanese Laid-Open Publication No. 5-101054).

In conventional LSI development methods, the design of a product and the preparation of documents therefor such as an operation manual and a product specification are performed in separate, different process steps. Thus, even if modifications to the specifics of a product have been reflected in design data for the LSI, such modifications may not be reflected in documents therefor, which may cause inconsistency to arise between the LSI design data and the documents. Another problem with the known LSI development methods is that the documents for the product are completed late after completion of the product. These problems cannot be settled by the document preparation supporting system mentioned.

SUMMARY OF THE INVENTION

It is therefore an object of the present invention to provide an LSI development support system for generating design data for an LSI and documents therefor which are consistent with each other.

To achieve the object, in the present invention, information on IPs (intellectual properties) for LSIs, serving as design assets for the LSIs, is stored in a database, from which design data and document data for each module of an LSI are extracted, and then converted and synthesized according to common individual detailed specifics, so that design data and documents for the LSI which are consistent with each other are produced.

Specifically, an inventive LSI development support system includes: a database which includes design data and document data for modules serving as LSI design assets, the design data and the document data being mutually related on a module-by-module basis, an input interface unit for inputting necessary information, a detailed-specific preparation temporary for preparing detailed-specific management information, which indicates the configuration of modules forming an LSI to be developed, and individual detailed specifics for each said module of the LSI, based on the information inputted in the input interface unit, a database selection unit for extracting, from the database, design data and document data for the modules specified in the detailed-specific management information, and a data conversion and synthesis unit for converting and synthesizing the extracted design and document data based on the individual detailed specifics. In this system, if a correction has been made to the individual detailed specifics, its results will be inevitably reflected in both the related LSI design data and documents.

BRIEF DESCRIPTION OF THE DRAWINGS

FIG. 2 illustrates an example of a port IP management data shown in FIG. 1.

FIG. 3 illustrates an example of a port IP detailed-specific template shown in FIG. 1.

FIG. 4 illustrates an example of a port IP operation manual data shown in FIG. 1.

FIG. 5 illustrates an example of a port IP specification data shown in FIG. 1.

FIG. 6 illustrates an example of a port IP design data shown in FIG. 1.

FIG. 11 illustrates an example of detailed-specific management information shown in FIG. 1.

FIG. 12 illustrates an example of individual detailed specifics shown in FIG. 1.

FIG. 13 illustrates an example of an output from an operation manual data conversion unit shown in FIG. 1.

FIG. 14 illustrates an example of an output from a specification data conversion unit shown in FIG. 1.

FIG. 15 illustrates an example of an output from a design data conversion unit shown in FIG. 1.

FIG. 17 illustrates an example of an operation manual outputted from the system shown in FIG. 1.

FIG. 18 illustrates an example of a product specification outputted from the system shown in FIG. 1.

FIG. 19 illustrates an example of design data outputted from the system shown in FIG. 1.

FIG. 29 illustrates the contents of a location information data table shown in FIG. 24 which corresponds to the layout data shown in FIG. 28.

FIG. 30 illustrates the contents of the location information data table shown in FIG. 24 after corrections.

DESCRIPTION OF THE PREFERRED EMBODIMENTS

Hereinafter, first through third embodiments of the present invention will be described with reference to the accompanying drawings.

(First Embodiment)

Figure 1:
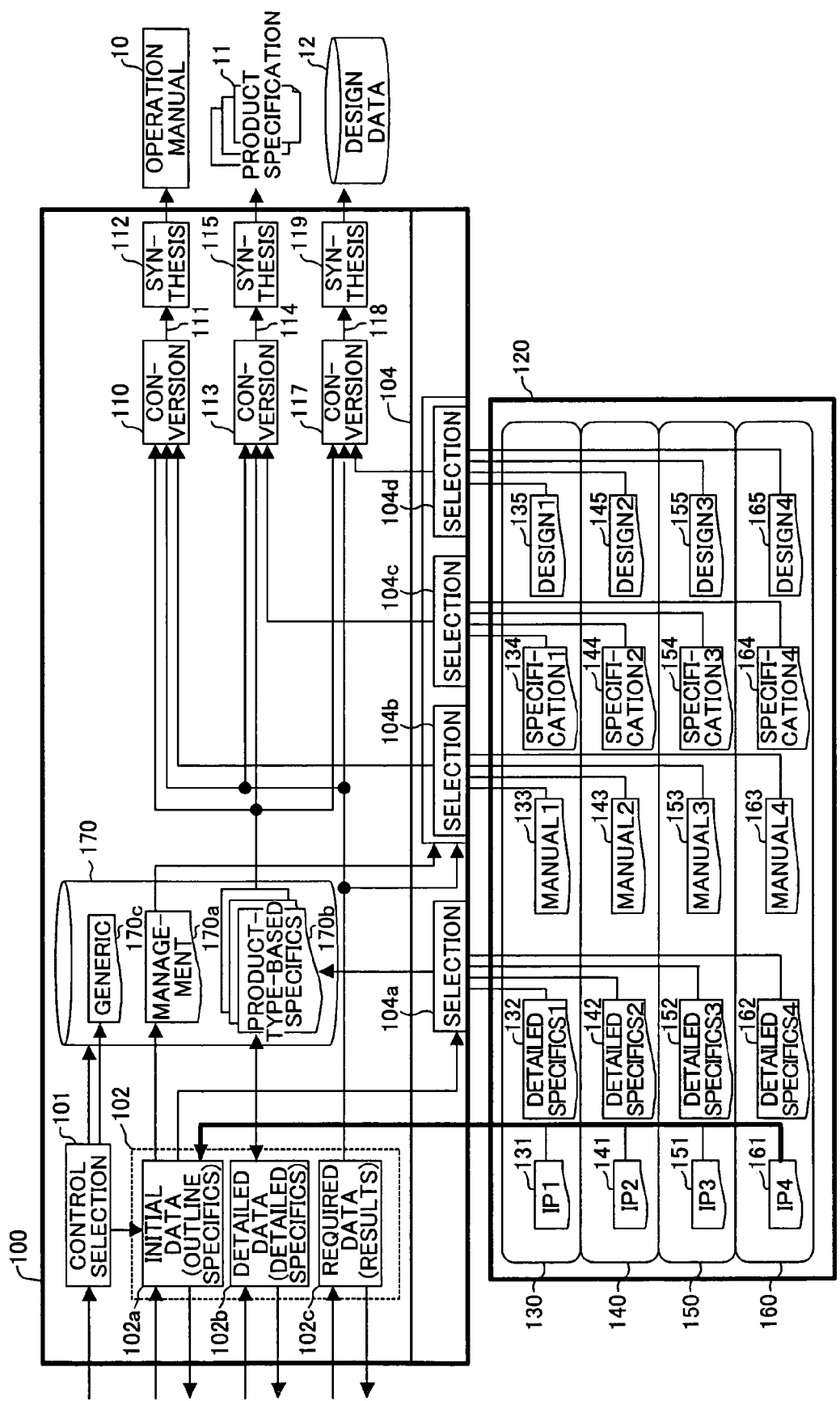
FIG. 1 is a block diagram illustrating the configuration of an LSI development support system in accordance with a first embodiment of the present invention.

FIG. 1 illustrates the configuration of an LSI development support system in accordance with a first embodiment of the present invention. The LSI development support system shown in FIG. 1 is a system for generating an operation manual 10, a product specification 11, and LSI design data 12 that are consistent with each other, and includes an LSI development support processing unit 100 and a registered-IP database 120. The LSI development support system can be used by not only designers of LSIs but also persons who prepare documents for the LSIs.

The registered-IP database 120 includes IP management data, a detailed-specific template, operation manual data, product specification data, and design data, for each module, i.e., each IP, serving as an LSI design asset. The detailed-specific template, operation manual data, specification data, and design data are all associated with each other by the IP management data. In the illustrated example, a port IP data group 130 consists of port IP management data 131, a port IP detailed-specific template 132, port IP operation manual data 133, port IP specification data 134, and port IP design data 135. A timer IP data group 140 includes timer IP management data 141, a timer IP detailed-specific template 142, timer IP operation manual data 143, timer IP specification data 144, and timer IP design data 145. Further, a serial IP data group 150 is composed of serial IP management data 151, a serial IP detailed-specific template 152, serial IP operation manual data 153, serial IP specification data 154, and serial IP design data 155. Furthermore, an AD IP data group 160 consists of AD IP management data 161, an AD IP detailed-specific template 162, AD IP operation manual data 163, AD IP specification data 164, and AD IP design data 165.

The LSI development support processing unit 100 includes a control selection unit 101, which is used by the operator to select an input mode of the system, and an input interface unit 102, which is used by the operator for inputting necessary information. The LSI development support processing unit 100 further includes a detailed-specific preparation temporary 170, a database selection unit 104, an operation manual data conversion unit 110, an operation manual data synthesis unit 112, a specification data conversion unit 113, a specification data synthesis unit 115, a design data conversion unit 117, and a design data synthesis unit 119. In the input interface unit 102, the reference numerals 102a, 102b and 102c denote an initial data input screen, a detailed data input screen, and a required data selection screen, respectively. On the required data selection screen 102c, an output of the operation manual 10 or an output of the product specification 11 can be selected, and in addition an output of RTL (register transfer level) data as the LSI design data 12 can be selected. In the detailed-specific preparation temporary 170, the reference numerals 170a, 170b, and 170c respectively denote detailed-specific management information, individual detailed specifics (product-type-based detailed-specifics), and generic data which is common for a product-type series. In the database selection unit 104, the reference numerals 104a, 104b, 104c and 104d respectively denote a detailed-specific template selection unit, an operation manual data selection unit, a specification data selection unit, and a design data selection unit. The reference numeral 111 denotes data which is outputted from the operation manual data conversion unit 110 to be supplied to the operation manual data synthesis unit 112. The reference numeral 114 denotes data which is outputted from the specification data conversion unit 113 to be supplied to the specification data synthesis unit 115. The reference numeral 118 denotes data which is outputted from the design data conversion unit 117 to be supplied to the design data synthesis unit 119.

The detailed-specific preparation temporary 170 holds the generic data 170c and also stores data therein for use in preparing the detailed-specific management information 170a and the individual detailed specifics 170b in accordance with information inputted in the input interface unit 102. The detailed-specific management information 170a indicates the module configuration of the LSI to be developed, while the individual detailed specifics 170b are specifics for each module constituting the target LSI.

The database selection unit 104 functions to extract from the registered-IP database 120 a detailed-specific template for a module specified in the input interface unit 102 and then transfer the extracted template to the detailed-specific preparation temporary 170 so that the individual detailed specifics 170b can be prepared by filling in blanks in the template. The database selection unit 104 also acts as a means for extracting from the registered-IP database 120 operation manual data, specification data, and design data for a module specified in the detailed-specific management information 170a.

The operation manual data conversion unit 110 and the operation manual data synthesis unit 112 function as means for converting and synthesizing module-based operation manual data extracted from the registered-IP database 120 into the operation manual 10 based on the individual detailed specifics 170b. The specification data conversion unit 113 and the specification data synthesis unit 115 act as means for converting and synthesizing module-based specification data extracted from the registered-IP database 120 into the product specification 11 based on the individual detailed specifics 170b. Further, the design data conversion unit 117 and the design data synthesis unit 119 function as means for converting and synthesizing module-based design data extracted from the registered-IP database 120 into the LSI design data 12 based on the individual detailed specifics 170b.

Next, how data is structured in the registered-IP database 120 will be described in detail by taking the port IP data group 130 as an example.

FIG. 2 illustrates an example of the port IP management data 131 shown in FIG. 1. The port IP management data 131 consists of six rows. "IP1=J710M0_PORT" shown in the first row means that the IP management number is "IP1" and the module name of IP1 is "J710M0_PORT". "Instance=XXXX" shown in the second row means that an instance name which has been inputted on the initial data input screen 102a is substituted for "XXXX". Further, "a:detailed specifics 1" in the third row, "b:manual 1" in the fourth row, "c:specification 1" in the fifth row, and "d:design 1" in the sixth row respectively mean that the port IP detailed-specific template 132, the port IP operation manual data 133, the port IP specification data 134, and the port IP design data 135 have been registered in the registered-IP database 120.

FIG. 3 illustrates an example of the port IP detailed-specific template 132 shown in FIG. 1. The port IP detailed-specific template 132 is a data format in the form of a table in which IP-setting information necessary for determining hardware structure has not been entered. The port IP detailed-specific template 132 is called up on the detailed data input screen 102b. Specifically, the port IP detailed-specific template 132 includes first through fifth columns, which are numbered in the increasing order from the left. In the first column, the port number "n" of each port to be specified has been entered. In the second column, fields, in which individual detailed information on a PnOUT register, i.e., an output control register for each such port is to be entered, are left blank. More specifically, the individual detailed information on, i.e., the address and state of the bit positions of, the PnOUT register has not yet been entered. In the third column, fields, in which individual detailed information on, i.e., the address and state of the bit positions of, a PnIN register that is an input control register for each such port is to be entered, are left blank. In the fourth column, fields, in which individual detailed information on, i.e., the address and state of the bit positions of, a PnDIR register that is a direction control register for each such port is to be entered, are left blank. In the fifth column, fields, in which individual detailed information on, i.e., the address and state of the bit positions, of a PnPLU register that is a pull-up resistor control register for each such port is to be entered, are left blank. In the first column, each port number shown is a numeral which will substitute during conversion performed by the operation manual data conversion unit 110. When a corresponding numeral of the port numbers in the first column is substituted for "n" in the respective register names of PnOUT, PnIN, PnDIR and PnPLU, their final register names are determined. The second column is an area for storing the individual detailed information on the PnOUT registers, and for each port number, the upper and lower sections in the second column respectively store the address of the PnOUT register and information on the bit positions of the PnOUT register. In each of the lower cells showing the bit-position information, information on the bits ranging from the MSB (most significant bit) to the LSB (least significant bit) is stored. The third, fourth and fifth columns have the same structure.

FIG. 4 illustrates an example of the port IP operation manual data 133 shown in FIG. 1. The operation manual data 133 is operation-manual component data and includes prepared descriptions corresponding to hardware structures. The port IP operation manual data 133 is structured so that when its portions which correspond to the blank fields in the port IP detailed-specific template 132 are filled in with specific data, the data can be used as a variable. The port IP operation manual data 133 is called up when an output of the operation manual 10 is selected on the required data selection screen 102c. Specifically, the port IP operation manual data 133 is composed of first through third columns. The first column indicates the names of registers. The second column shows descriptions for the registers in the case of the presence of the PnDIR register. Shown in the third column are descriptions for each register in the case where there is no PnDIR register. More specifically, the first column shows register names, and the operation manual data 133 stores respective descriptions for the PnOUT, PnIN, PnDIR and PnPLU registers included in the port IPs. The character "n" in the character strings specifying the register names will be replaced by a numeral during conversion performed by the operation manual data conversion unit 110. The second column shows descriptions corresponding to the register names of PnOUT, PnIN, PnDIR and PnPLU shown in the first column, and the character "n" shown in the descriptions will be replaced by a numeral during conversion performed by the operation manual data conversion unit 110. The third column indicates descriptions for the case where no PnDIR register is specified, and the character "n" shown in the descriptions will be replaced by a numeral during conversion performed by the operation manual data conversion unit 110. In the third column, the cell for descriptions for the PnDIR register shows "–", which means that there is no description for the PnDIR register. Also in the third column, the cell for descriptions for the PnPLU register shows "=", which means that the descriptions for the PnDIR register are the same as the corresponding descriptions shown in the second column.

FIG. 5 illustrates an example of the port IP specification data 134 shown in FIG. 1. The specification data 134 is product-specification component data and includes data of I/O cells corresponding to hardware structures. The port IP specification data 134 has a structure in which when its portions corresponding to the blank fields in the port IP detailed-specific template 132 are filled in with specific data, the data can be used as a variable. The port IP specification data 134 is called up when an output of the product specification 11 is selected on the required data selection screen 102c. More specifically, in the port IP specification data 134, the leftmost, first column shows specification-defining items which include input voltage high level, input voltage low level, pull-up resistor, input leakage current, output voltage high level, and output voltage low level. For each item, the second, third, fourth, fifth, sixth, and seventh rows respectively indicate an abbreviation, condition, allowable minimum value, allowable standard value, allowable maximum value, and unit. In the character string "Pnm", the characters "n" and "m" will be replaced with respective numerals during conversion performed by the specification data conversion unit 113.

FIG. 6 illustrates an example of the port IP design data 135 shown in FIG. 1. The design data 135 includes connection information corresponding to hardware structures, and is structured in such a manner that when blank fields on the port IP detailed-specific template 132 are filled in with specific data, the data can be used as a variable. The port IP design data 135 is called up when an output of the LSI design data 12 is selected on the required data selection screen 102c. More specifically, the design data 135 shows information on connection terminals for IPs in the form of a table. In the table, modules from which wirings start and modules to which the wirings extend are shown by proving such module names, instance names, and terminal names, and corresponding names have been entered.

Now, the operator selects one operation from the initial data input screen 102a, detailed data input screen 102b and required data selection screen 102c in the input interface unit 102 using the control selection unit 101 shown in FIG. 1.

Figure 7:
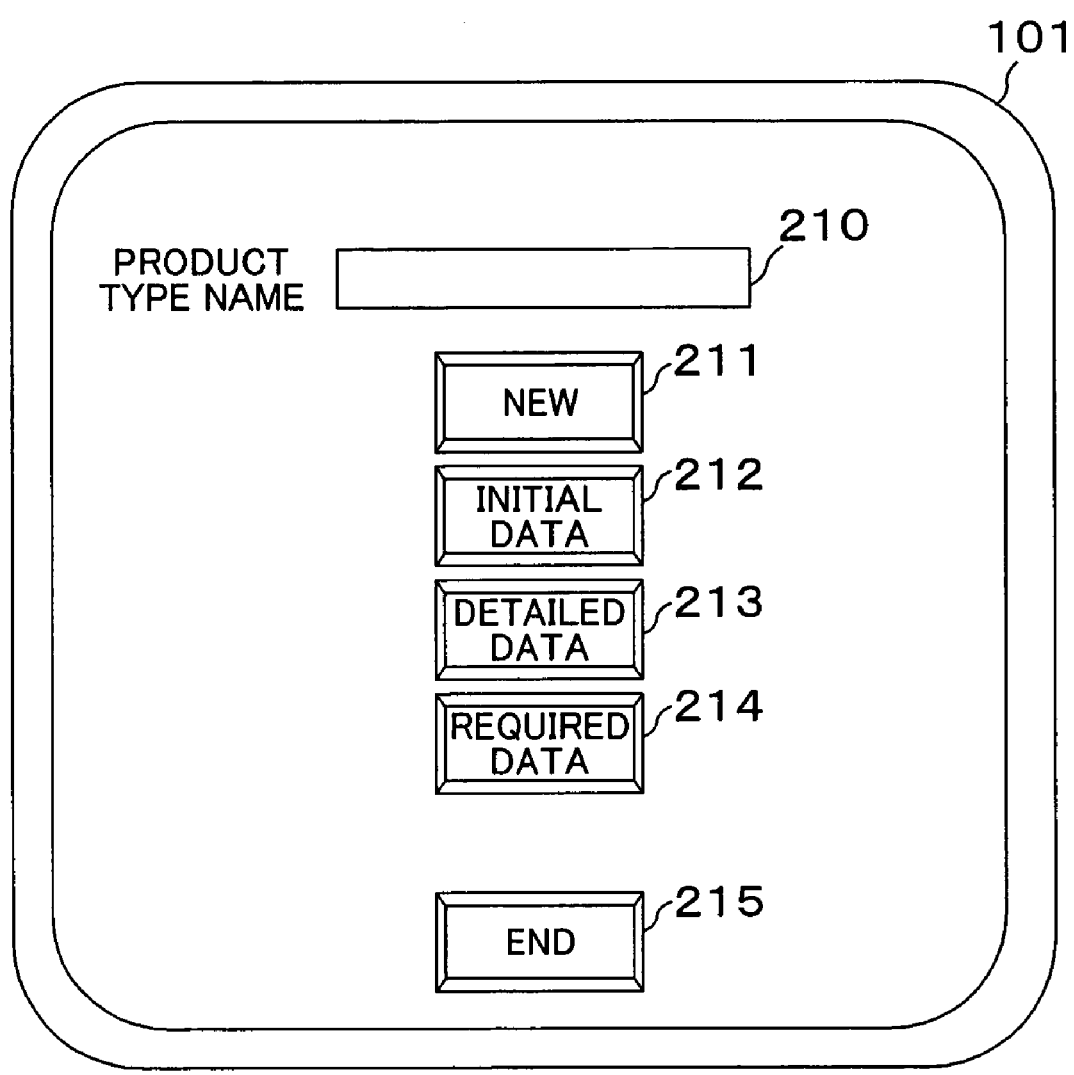
FIG. 7 illustrates an example of a control selection screen of the system shown in FIG. 1.

FIG. 7 illustrates an example of an input mode selection screen displayed by the control selection unit 101 of the system shown in FIG. 1. The operator first inputs the name of a product type 210 and then clicks on a new registration button 211. The individual detailed specifics 170b is created and the detailed-specific preparation temporary 170 is prepared to hold it. At the same time, the generic data 170c common for the product-type series is automatically provided in the detailed-specific preparation temporary 170.

Thereafter, one of an initial data button 212, a detailed data button 213, and a required data button 214 is clicked to select an input mode. By clicking on the initial data button 212, the initial data input screen 102b will be appeared. By clicking on the detailed data button 213, the initial data input screen 102b will be appeared. By clicking on the required data button 214, the initial data input screen 102b will be appeared. Clicking on an end button 215 causes the operation of the system to end.

Figure 8:
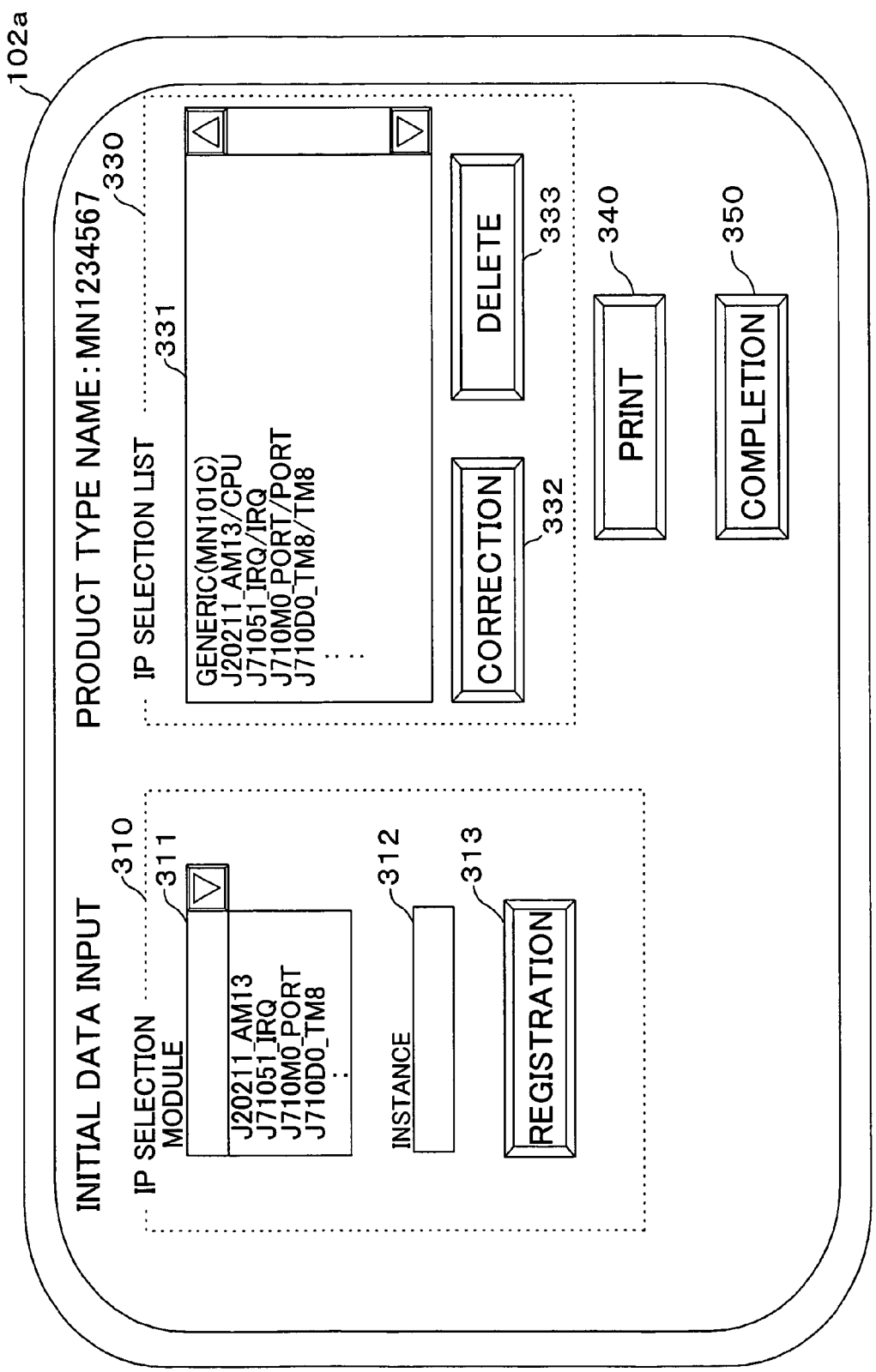
FIG. 8 illustrates an example of an initial data input screen of the system shown in FIG. 1.

FIG. 8 illustrates an example of the initial data input screen 102a of the system shown in FIG. 1. The individual detailed specifics 170b shown in FIG. 1 are obtained by inputting on the detailed data input screen 102b necessary information in a detailed-specific template for an IP specified on the initial data input screen 102a.

The initial data input screen 102a includes an IP selection unit 310, an IP selection list 330, a print button 340, and a completion button 350. The IP selection unit 310 is used to select IPs that form the LSI to be developed. The IP selection list 330 indicates the IPs that have been selected in the IP selection unit 310. The print button 340 is used to give instructions to print the contents of the IP selection list 330. The completion button 350 is clicked when initial data input has been completed. The product type name "MN1234567" shown in the upper right of the screen is the product type name that has been inputted on the control selection unit 101 screen. Clicking on the print button 340 allows contents shown in the IP selection list 330 to be printed out from a printer to which this system is connected.

The IP selection unit 310 consists of a pull-down menu 311, an input window 312, and a registration button 313. The pull-down menu 311 is used to select the module name of an IP. In the input window 312, an instance name is entered. The registration button 313 is used to register the selected IP. In the pull-down menu 311, a name is selected as the module name of an IP, and an instance name is inputted in the input window 312, then finally the registration button 313 is clicked. The IP is selected by this process, and repeating this process allows a plurality of IPs to be selected. In the pull-down menu 311 for selecting a module name, the illustrated "J20211_AM13", "J71051_IRQ", "J710M0_PORT", and "J710D0_TM8" are a core IP for a microcontroller, an interrupt IP, a port IP, and an 8-bit timer IP, respectively.

The IP selection list 330 shows the results of the IPs that have been selected and registered in the IP selection unit 310, and includes a list portion 331, a correction button 332 and a delete button 330. In the list portion 331, the results of the registered IPs are shown. The correction button 332 is used to give instructions to modify the selected IPs. The delete button 330 is used to give instructions to deselect the selected IPs. In the list portion 331 in which the results of the registered IPs are shown, the "module name/instance name" of each IP that has been registered through the IP selection process is displayed. In the list portion 331, "Generic (MN101C)" is an item showing the generic function of the target LSI, and refers to the generic data 170c provided in the detailed-specific preparation temporary 170 during the new registration. Under "Generic (MN101C)", selected module names are shown along with their respective instance names. The correction button 332 is used to correct the instance names of the registered IPs. In the list portion 331, if an IP to be corrected is selected and the correction button 332 is clicked, then information on the selected IP is displayed on the IP selection unit 310, allowing the correction of the instance name. The delete button 333 is used to delete the registered IPs. In the list portion 331, when an IP to be deleted is selected and the delete button 333 is clicked, the IP is deleted from the list portion 331.

Upon completion of the initial data input, clicking on the completion button 350 causes a return to the control selection unit 101. When the completion button 350 is clicked, the instance names are substituted for corresponding portions in management data for the selected IPs based on the IP selection list 330, and the resultant data is provided as the detailed-specific management information 170a to the detailed-specific preparation temporary 170. Further, the detailed-specific template selection unit 104a extracts corresponding detailed-specific templates from the registered-IP database 120 to write the extracted templates as the individual detailed specifics 170b on the detailed-specific preparation temporary 170.

Next, the detailed data button 213 of the control selection unit 101 is clicked and individual detailed information is entered on the detailed data input screen 102b. Of the modules selected on the initial data input screen 102a, one module is selected and detailed information thereon is then inputted in accordance with the format. Detailed information is inputted one after another for necessary IPs. Upon completion of the information input, the operations performed on the detailed data input screen 102b is ended to return to the control selection unit 101.

Figure 9:
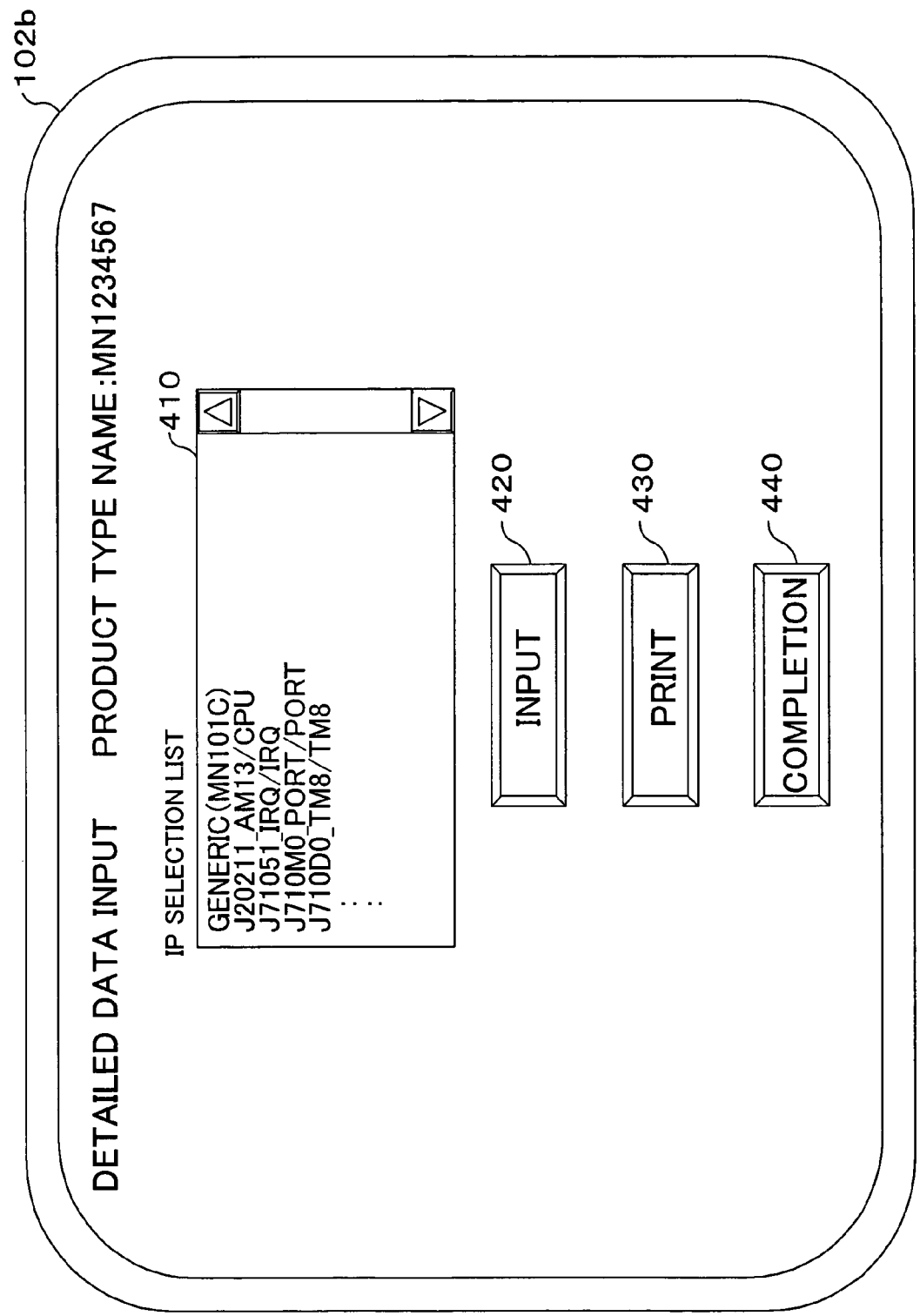
FIG. 9 illustrates an example of a detailed data input screen of the system shown in FIG. 1.

FIG. 9 illustrates an example of the detailed data input screen 102b of the system shown in FIG. 1. The detailed data input screen 102b includes an IP selection list 410, an input button 420, a print button 430, and a completion button 440. The IP selection list 410 is a list of the IPs that have been selected as components forming the LSI to be developed. The input button 420 is used for input of detailed information. The print button 430 is used to give instructions to print detailed specifics for an IP selected from the IP selection list 410. The completion button 440 is clicked when input of detailed information has been completed. The product type name "MN1234567" shown in the upper right of the screen is the product type name that has been entered on the control selection unit 101 screen. The IP selection list 410 shows the results of the IPs that have been selected on the initial data input screen 102a. Upon completion of input of detailed information using the input button 420, if the completion button 440 is clicked, the operations performed on the detailed data input screen 102b are ended, resulting in a return to the control selection unit 101.

Next, the required data button 214 in the control selection unit 101 is clicked, and required data is selected on the required data selection screen 102c. When an output of the required data has been completed, the operations on the required data selection screen 102c are ended to cause a return to the control selection unit 101.

Figure 10:
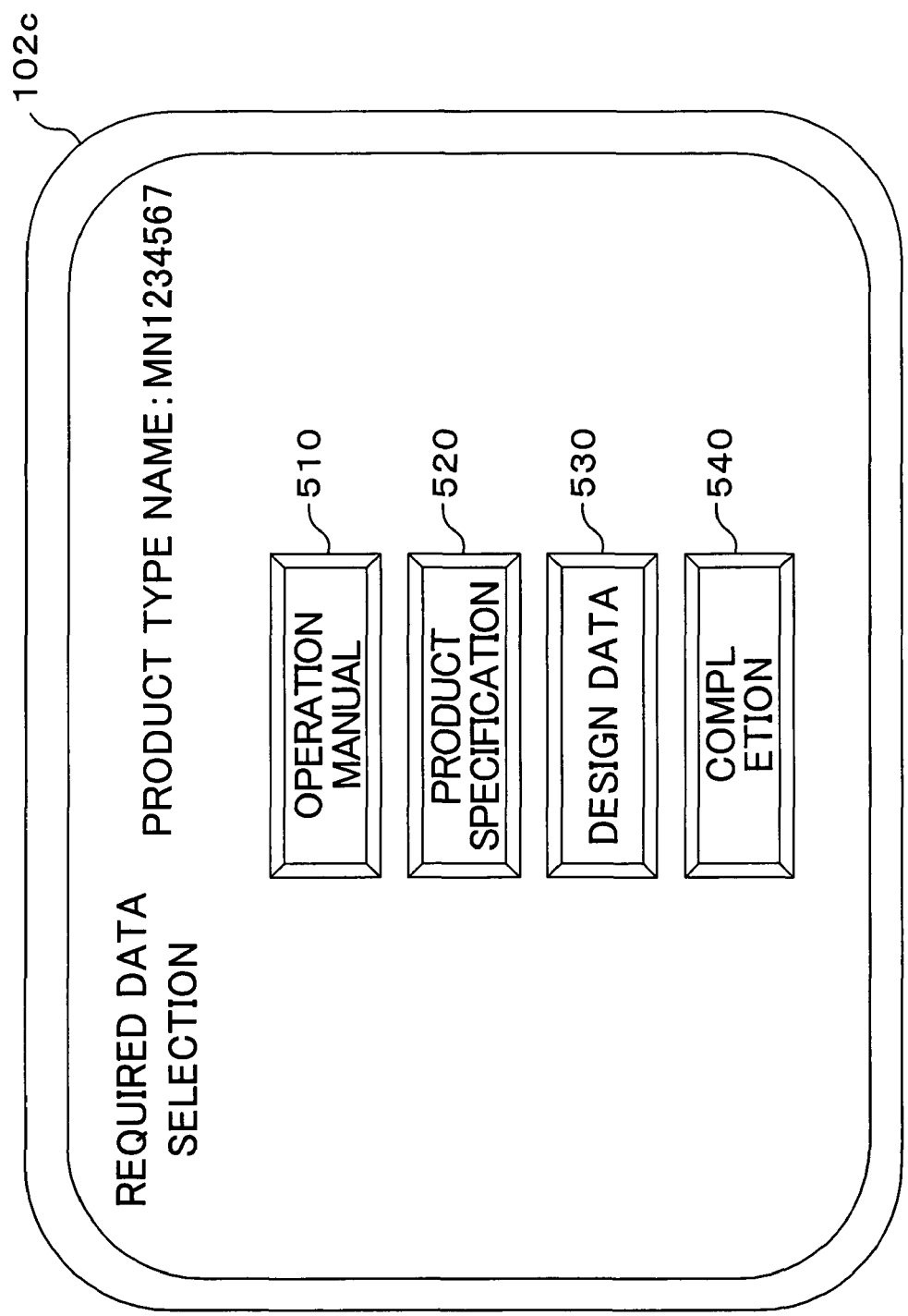
FIG. 10 illustrates an example of a required data selection screen of the system shown in FIG. 1.

FIG. 10 illustrates an example of the required data selection screen 102c of the system shown in FIG. 1. The required data selection screen 102c consists of an operation manual button 510, a product specification button 520, a design data button 530, and a completion button 540. The operation manual button 510 is used to select an output of the operation manual 10. The product specification button 520 is used to select an output of the product specification 11. The design data button 530 is used to select an output of the LSI design data (RTL data) 12. The completion button 540 is clicked at the time that an output of required data has been completed. The product type name "MN1234567" shown in the upper right of the screen is the product type name that has been inputted on the control selection unit 101 screen. When the operation manual button 510 is clicked, the operation manual data selection unit 104b extracts operation manual data from the registered-IP database 120 in accordance with the detailed-specific management information 170a and outputs the extracted operation manual data to the operation manual data conversion unit 110. When the product specification button 520 is clicked, the specification data selection unit 104c extracts specification data from the registered-IP database 120 in accordance with the detailed-specific management information 170a and outputs the extracted specification data to the specification data conversion unit 113. When the design data button 530 is clicked, the design data selection unit 104d extracts design data from the registered-IP database 120 in accordance with the detailed-specific management information 170a and outputs the extracted design data to the design data conversion unit 115. When the completion button 540 is clicked, the operations on the required data selection screen 102c are ended, resulting in a return to the control selection unit 101. It should be noted that the individual detailed specifics 170b are also outputted to the operation manual data conversion unit 110, the specification data conversion unit 113, and the design data conversion unit 115.

Next, respective specific examples of the detailed-specific management information 170a and the individual detailed specifics 170b in the detailed-specific preparation temporary 170 will be described.

FIG. 11 illustrates an example of the detailed-specific management information 170a shown in FIG. 1. The detailed-specific management information 170a is information for managing the individual detailed specifics 170b for each IP. In the illustrated example, the first IP is an IP whose IP management number and module name are indicated by "IP2" and "J20211_AM13", respectively. The second IP is an IP whose IP management number and module name are indicated by "IP3" and "J7151_IRQ", respectively. The third IP is an IP whose IP management number and module name are indicated by "IP1" and "J710M0_PORT", respectively. The fourth IP is an IP whose IP management number and module name are indicated by "IP4" and "J710D0_TM8", respectively.

FIG. 12 illustrates an example of the individual detailed specifics 170b shown in FIG. 1. The illustrated individual detailed specifics 170b show information that is stored in the detailed-specific preparation temporary 170 and that has been inputted in the detailed-specific template for the third IP "IP1=J710M0_PORT". Specifically, the individual detailed specifics 170b show individual detailed information corresponding to the product type name "MN1234567", the information having been entered in the blank cells in the port IP detailed-specific template 132. First, the second row indicating the port number "0" in its leftmost cell will be described. The second row shows individual detailed information on registers for the port 0. Specifically, the address of a register PnOUT for the port 0 is "3F10" and information specified in its bit positions is "01111111" from the MSB side. The address of a register PnIN for the port 0 is "3F20" and information specified in its bit positions is "01111111" from the MSB side. The address of a register PnDIR for the port 0 is "3F30" and information specified in its bit positions is "01111111" from the MSB side. The address of a register PnPLU for the port 0 is "3F40" and information specified in its bit positions is "01111111" from the MSB side. Next, individual detailed information on registers for the port 1 shown in the third row indicating the port number "1" in its leftmost cell will be described. The address of a register PnOUT for the port 1 is "3F11" and information specified in its bit positions is "00011111" from the MSB side. The address of a register PnIN for the port 1 is "3F21" and information specified in its bit positions is "00011111" from the MSB side. The address of a register PnDIR for the port 1 is indicated by "NOT", which means that no PnDIR register exists for the port 1. The address of a register PnPLU for the port 1 is "3F41" and information specified in its bit positions is "00011111" from the MSB side.

Subsequently, it will be described how the system operates to output required data. For example, by clicking on the operation manual button 510 on the required data selection screen 102c, an output of the operation manual 10 is selected. At this time, the operation manual data selection unit 104b extracts operation manual data for IPs that have been specified in the detailed-specific management information 170a from the registered-IP database 120 and outputs the extracted data to the operation manual data conversion unit 110. Simultaneously with this, the individual detailed specifics 170b are transferred to the operation manual data conversion unit 110. The operation manual data conversion unit 110 replaces variables in the inputted operation manual data with corresponding portions of the individual detailed specifics 170b to create operation manual data 111 which is unique to the product type.

FIG. 13 illustrates an example of the data 111 outputted from the operation manual data conversion unit shown in FIG. 1. The product-type's unique operation manual data 111 outputted from the operation manual data conversion unit 110 is data written in a markup language, SGML (Standard Generalized Markup Language), and thus is in the form of text data with tags. Referring to FIG. 13, in the outputted operation manual data 111, the variable "n" shown in the descriptions for the register name PnOUT in the port IP operation manual data 133 illustrated in FIG. 4, for example, has been replaced by the port number "0". The operation manual data synthesis unit 112. Determines the layout of the operation manual data 111 on paper and then synthesizes the operation manual 10 for the entire LSI.

FIG. 14 illustrates an example of the data 114 outputted from the specification data conversion unit shown in FIG. 1. This data results from replacement operations performed by the specification data conversion unit 113 in which the variables (n and m) in the port IP specification data 134 illustrated in FIG. 5 have been replaced with corresponding portions of the port IP individual detailed specifics 170b shown in FIG. 12. The specification data synthesis unit 115 determines the layout of the specification data 114 on paper and then synthesizes the product specification 11 for the entire LSI.

FIG. 15 illustrates an example of the data 118 outputted from the design data conversion unit shown in FIG. 1. This is a table obtained in the design data conversion unit 117 in which connection information has been entered in the blank fields in the port IP design data 135 shown in FIG. 6 based on the port IP individual detailed specifics 170b shown in FIG. 12. The connection information for terminals shown in the table has been synthesized using corresponding bit data "0" or "1" in the ports and registers shown in the individual detailed specifics 170b. The design data synthesis unit 119 synthesizes the design data 12 for the entire LSI from the design data 118 for each IP.

Figure 16:
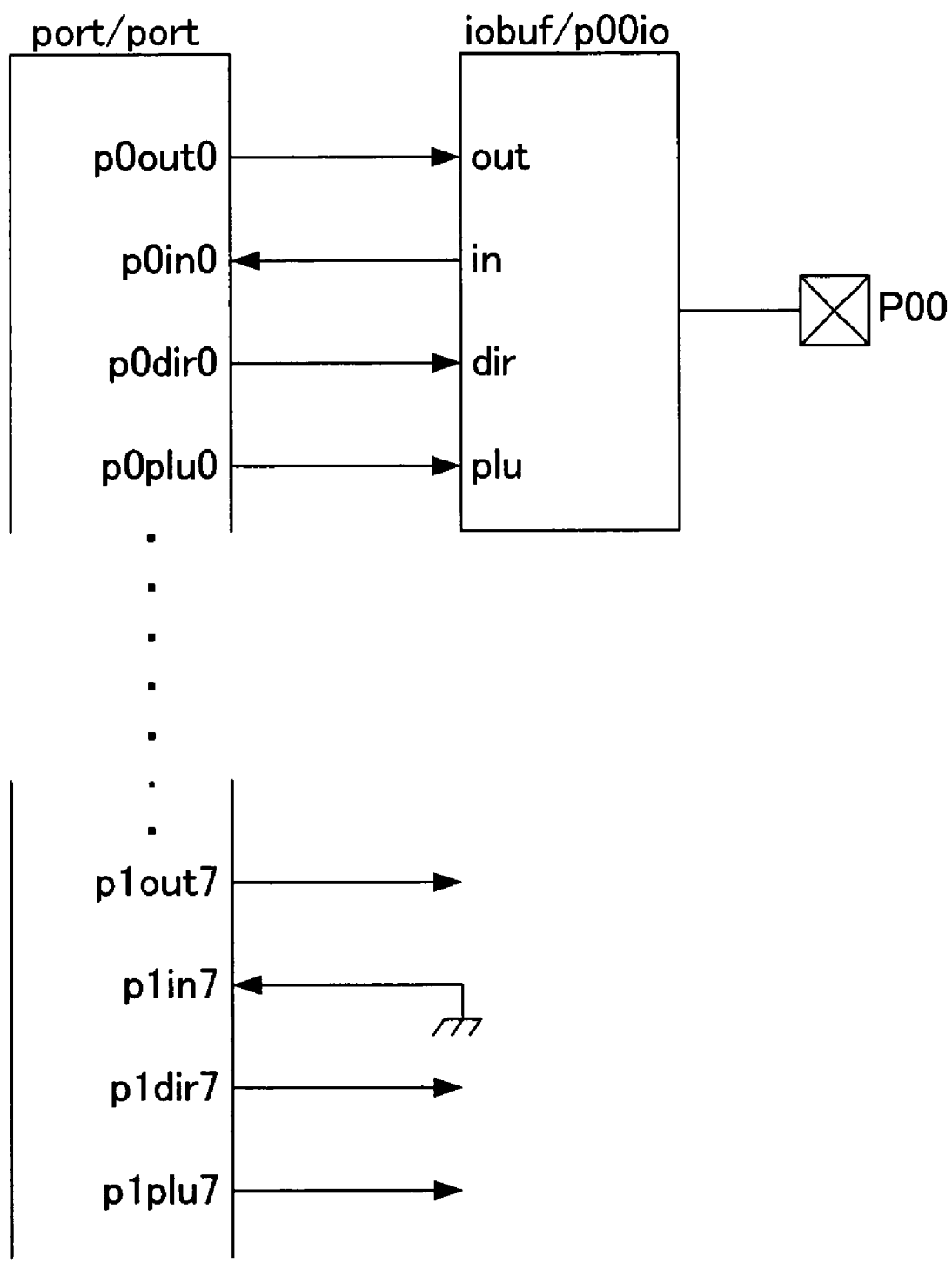
FIG. 16 is a wiring diagram which corresponds to the design data shown in FIG. 15.

FIG. 16 is a wiring diagram which corresponds to the design data 118 shown in FIG. 15, and illustrates how connection is established for a port terminal P00.

Respective examples of the operation manual 10, product specification 11, and LSI design data 12 that are finally outputted from the LSI development support system shown in FIG. 1 are shown in FIGS. 17, 18 and 19. With the system shown in FIG. 1, the operation manual 10, product specification 11, and LSI design data 12 which are consistent with each other can be produced.

(Second Embodiment)

Figure 20:
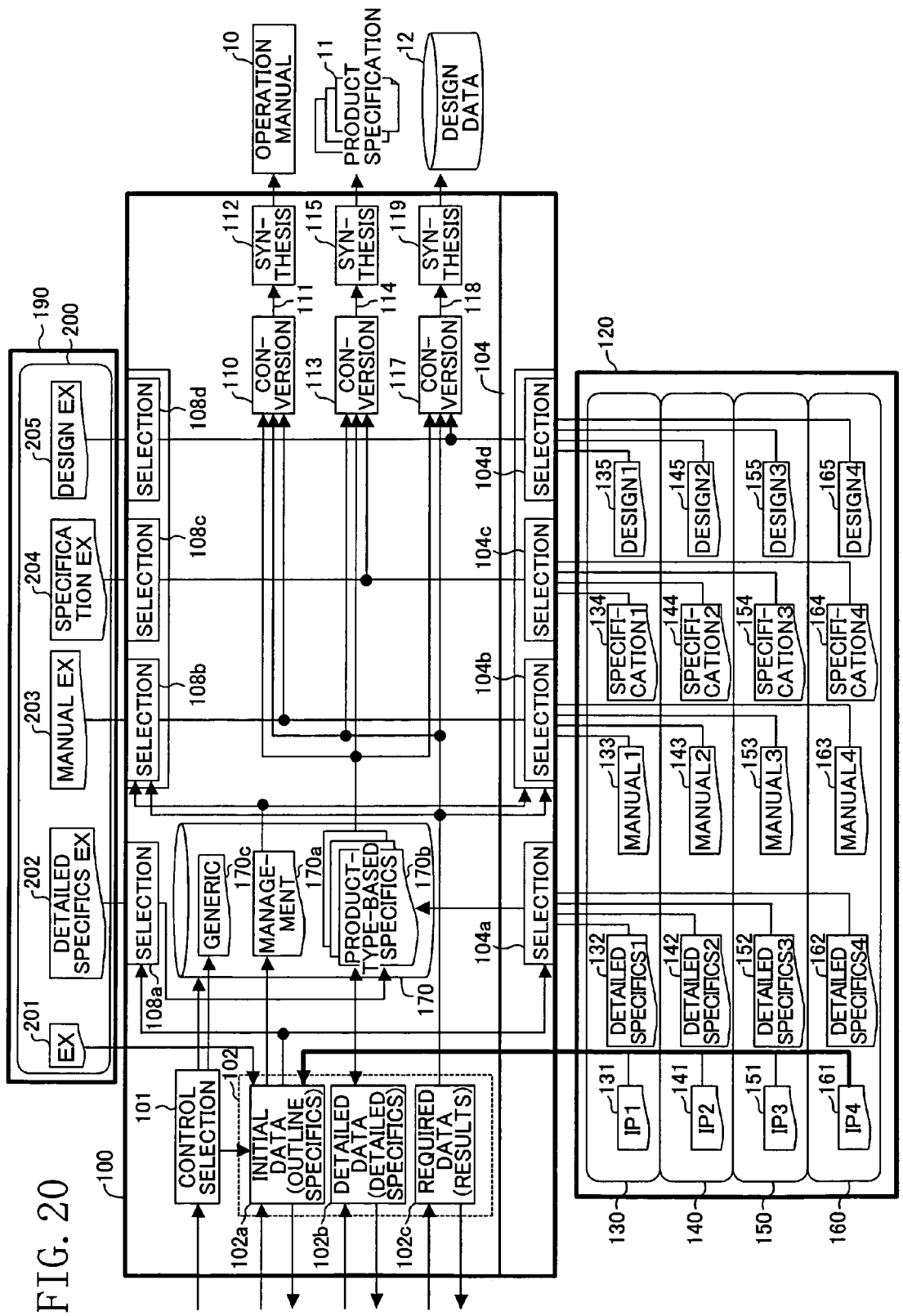
FIG. 20 is a block diagram illustrating the configuration of an LSI development support system in accordance with a second embodiment of the present invention.

FIG. 20 illustrates the configuration of an LSI development support system in accordance with a second embodiment of the present invention. The LSI development support system shown in FIG. 20 is structured so that mutually related design data and document data can be used in addition to the registered data in the registered-IP database 120 shown in FIG. 1. Specifically, in the LSI development support system of this embodiment, an unregistered-IP database 190 is added to the system shown in FIG. 1 and an unregistered-IP database selection unit 180 is also added to the LSI development support processing unit 100 shown in FIG. 1.

The unregistered-IP database 190 includes an unregistered-IP data group 200 as extra data with respect to the registered-IP database 120, and the unregistered-IP data group 200 consists of IP management data 201, a detailed-specific template 202, operation manual data 203, product specification data 204, and design data 205. The detailed-specific template 202, operation manual data 203, product specification data 204, and design data 205 are associated with each other by the IP management data 201. In the unregistered-IP database selection unit 180, the reference numerals 180a, 180b, 180c, and 180d denote a detailed-specific template selection unit, an operation manual data selection unit, a specification data selection unit, and a design data selection unit, respectively.

Figure 21:
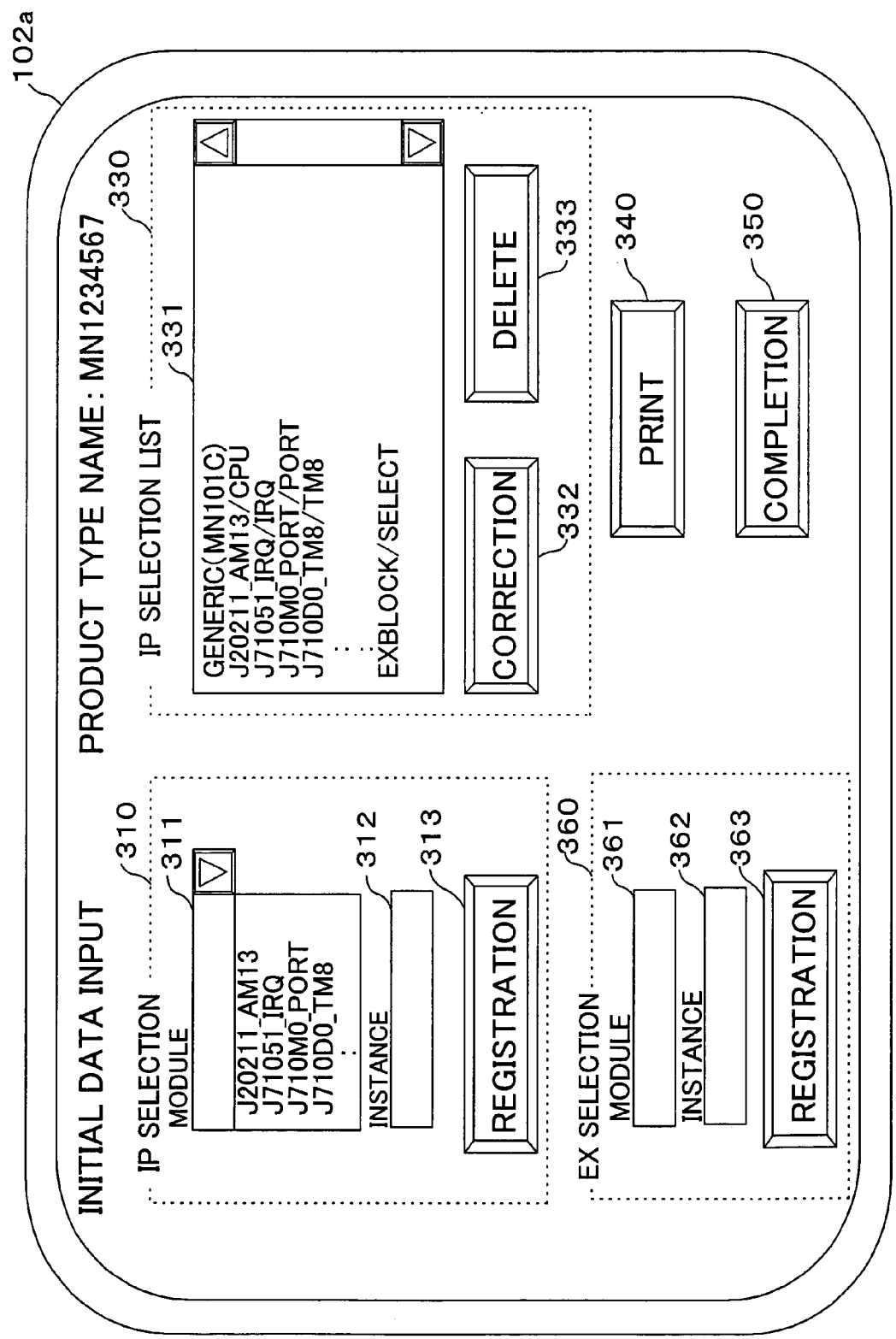
FIG. 21 illustrates an example of an initial data input screen of the system shown in FIG. 20.

FIG. 21 illustrates an example of an initial data input screen 102a of the system shown in FIG. 20. The reference numeral 360 denotes an unregistered-IP selection unit, which consists of an input window 361 for inputting a module name, an input window 362 for inputting an instance name, and a registration button 363 for registering a selected IP. An unregistered IP is selected by entering the name of the unregistered IP in the input window 361, inputting an instance name therefor in the input window 362, and then clicking on the registration button 363. Repeating this process allows a plurality of unregistered IPs to be selected.

The LSI development support system shown in FIG. 20 is capable of producing operation manual 10, product specification 11 and LSI design data 12 which are consistent with each other based on more information than in the first embodiment.

(Third Embodiment)

Figure 22:
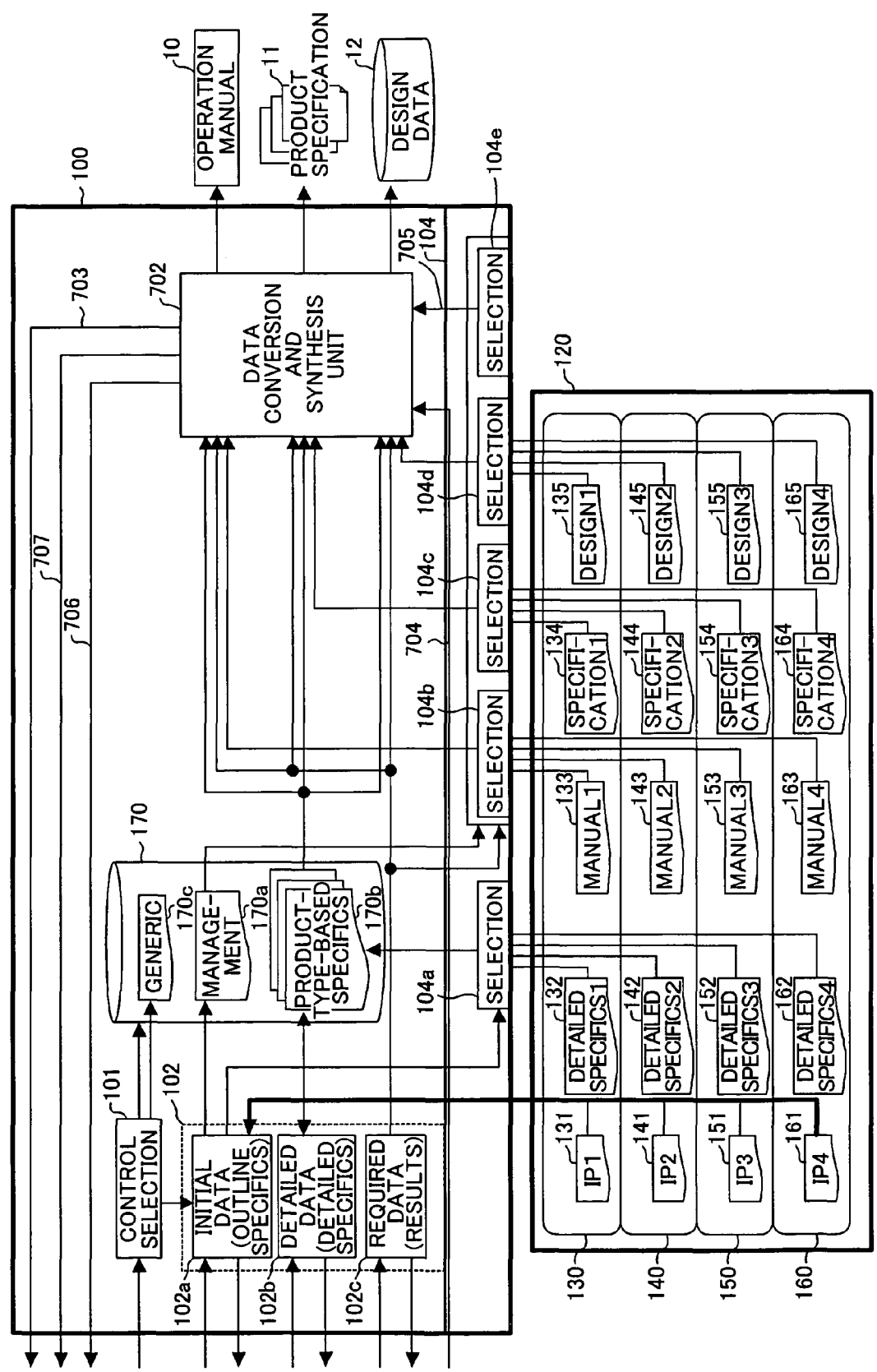
FIG. 22 is a block diagram illustrating the configuration of an LSI development support system in accordance with a third embodiment of the present invention.

FIG. 22 illustrates the configuration of an LSI development support system in accordance with a third embodiment of the present invention. The system shown in FIG. 22, unlike the structure shown in FIG. 1, employs a data conversion and synthesis unit 702. Further, in the system of this embodiment, port IP version data 136, timer IP version data 146, serial IP version data 156, and AD IP version data 166 are added to the registered-IP database 120, and an IP version data selection unit 104e is added to the database selection unit 104. The reference numeral 703 denotes inquiry data to the operator, while the reference numeral 704 denotes reply data from the operator. The reference numerals 705, 706 and 707 respectively denote IP version information, version indicating data, and layout indicating data.

The data conversion and synthesis unit 702 converts data that has been specified in a required data selection phase into the required document format and then outputs operation manual 10, product specification 11, or LSI design data 12 as the result in the same manner as described in the first embodiment. The data conversion and synthesis unit 702 also outputs the inquiry data 703 to the operator and receives the reply data 704 from the operator, such that text data and layout data can be corrected before the operation manual 10, product specification 11, or LSI design data 12 is produced. This means that the operation manual 10, product specification 11, and LSI design data 12 can be created and completed without using any incorrect data. The IP version information 705 is outputted from the IP version data selection unit 104e to the data conversion and synthesis unit 702. The version indicating data 706 is data which is sent from the data conversion and synthesis unit 702 to the operator to indicates the IP version information 705. The layout indicating data 707 is data which is sent from the data conversion and synthesis unit 702 to the operator to indicate layout.

Figure 23:
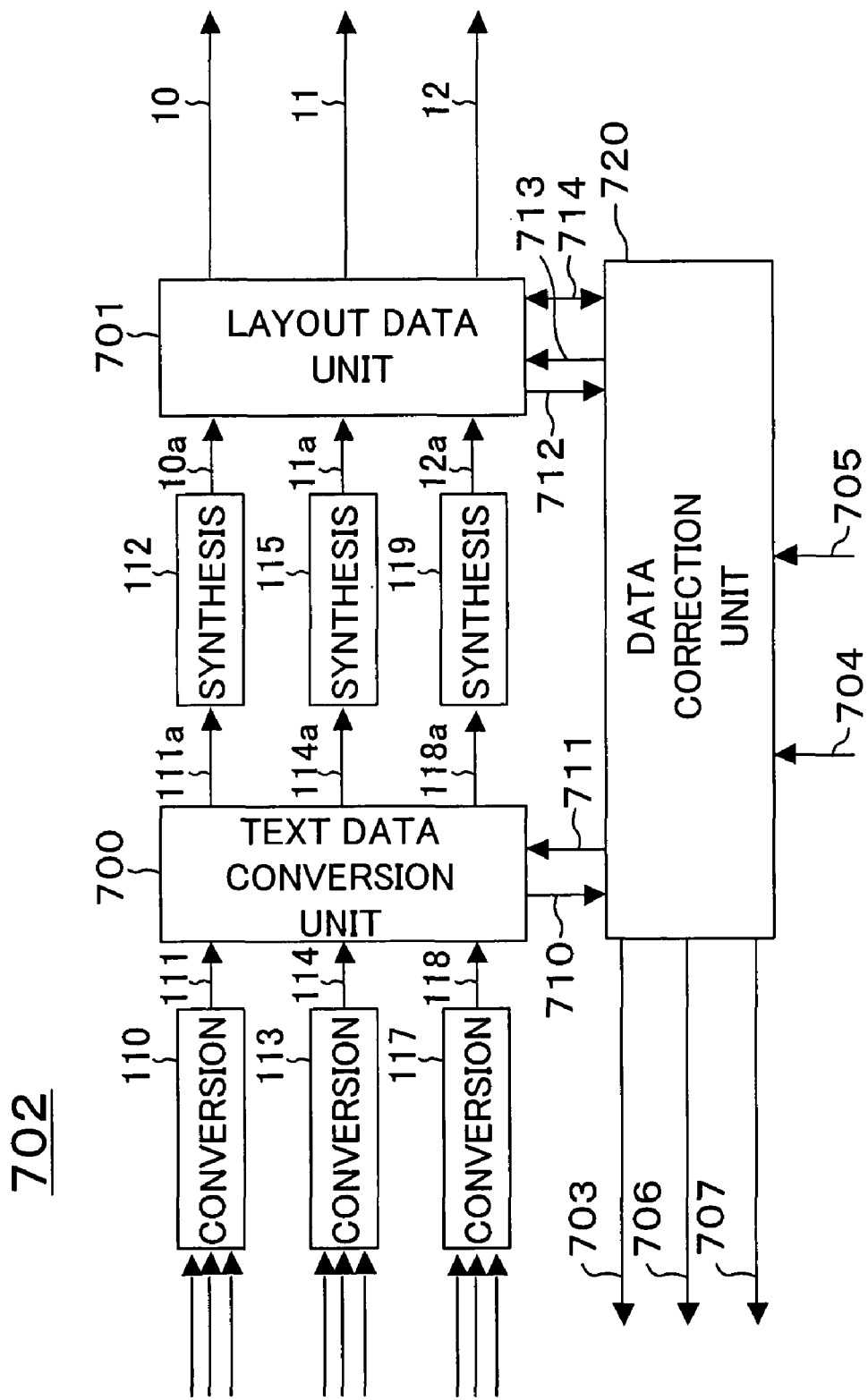
FIG. 23 is a block diagram illustrating the detailed configuration of a data conversion and synthesis unit shown in FIG. 22.

FIG. 23 illustrates the detailed configuration of the data conversion and synthesis unit 702 shown in FIG. 22. In FIG. 23, the reference numerals 700, 701 and 720 denote a text data unit, a layout data unit, and a data correction unit, respectively. An operation manual data conversion unit 110, a specification data conversion unit 113, and a design data conversion unit 117 perform their respective predetermined processes to output their results to the text data unit 700 as in the first embodiment. When data 111, data 114 and data 118 are inputted, the text data unit 700 stores all the data. At the time that the processes of storing all the data have been completed, the text data unit 700 outputs a signal 710 to the data correction unit 720. The data correction unit 720, upon receipt of the signal 710 from the text data unit 700, outputs the inquiry data 703 to the operator to ask whether the text data versions of the data 111, 114 and 118 should be checked or not.

The operator provides the reply data 704 to the data correction unit 720 in response to the inquiry sent from the data correction unit 720. In the case where the version checking is requested in the reply data 704, the data correction unit 720 obtains the IP version information 705 to perform a predetermined process and then outputs a completion signal 711 to the text data unit 700. On the other hand, in the case where the version checking is not requested in the reply data 704, the data correction unit 720 does not carry out the predetermined process and outputs the completion signal 711 to the text data unit 700. The process performed by the data correction unit 720 will be described later.

Upon receipt of the completion signal 711 inputted from the data correction unit 720, the text data unit 700 outputs data 11a, 114a and 118a to an operation manual data synthesis unit 112, specification data synthesis unit 115, and design data synthesis unit 119, respectively. As in the first embodiment, the operation manual data synthesis unit 112, specification data synthesis unit 115, and design data synthesis unit 119 perform their respective predetermined processes and outputs operation manual layout data 10a, specification layout data 11a and design layout data 12a to the layout data unit 701. Upon receipt of the layout data 10a, 11a and 12a, the layout data unit 701 holds all the data. When the processes for holding all the data have been completed, the layout data unit 701 outputs a signal 712 to the data correction unit 720.

When the signal 712 is inputted from the layout data unit 701, the data correction unit 720 outputs the inquiry data 703 to the operator to ask whether the layout data 10a, 11a and 12a should be checked or not. The operator provides the data correction unit 720 with the reply data 704 in response to the inquiry data 703 from the data correction unit 720. In the case where the layout checking is requested in the reply data 704, the data correction unit 720 makes the layout data unit

701 output necessary layout data 714 to the data correction unit 720 so as to perform a predetermined process and then outputs a completion signal 713 to the layout data unit 701. On the other hand, in the case where the layout checking is not requested in the reply data 704, the data correction unit 720 does not carry out the predetermined process and outputs the completion signal 713 to the layout data unit 701.

Figure 24:
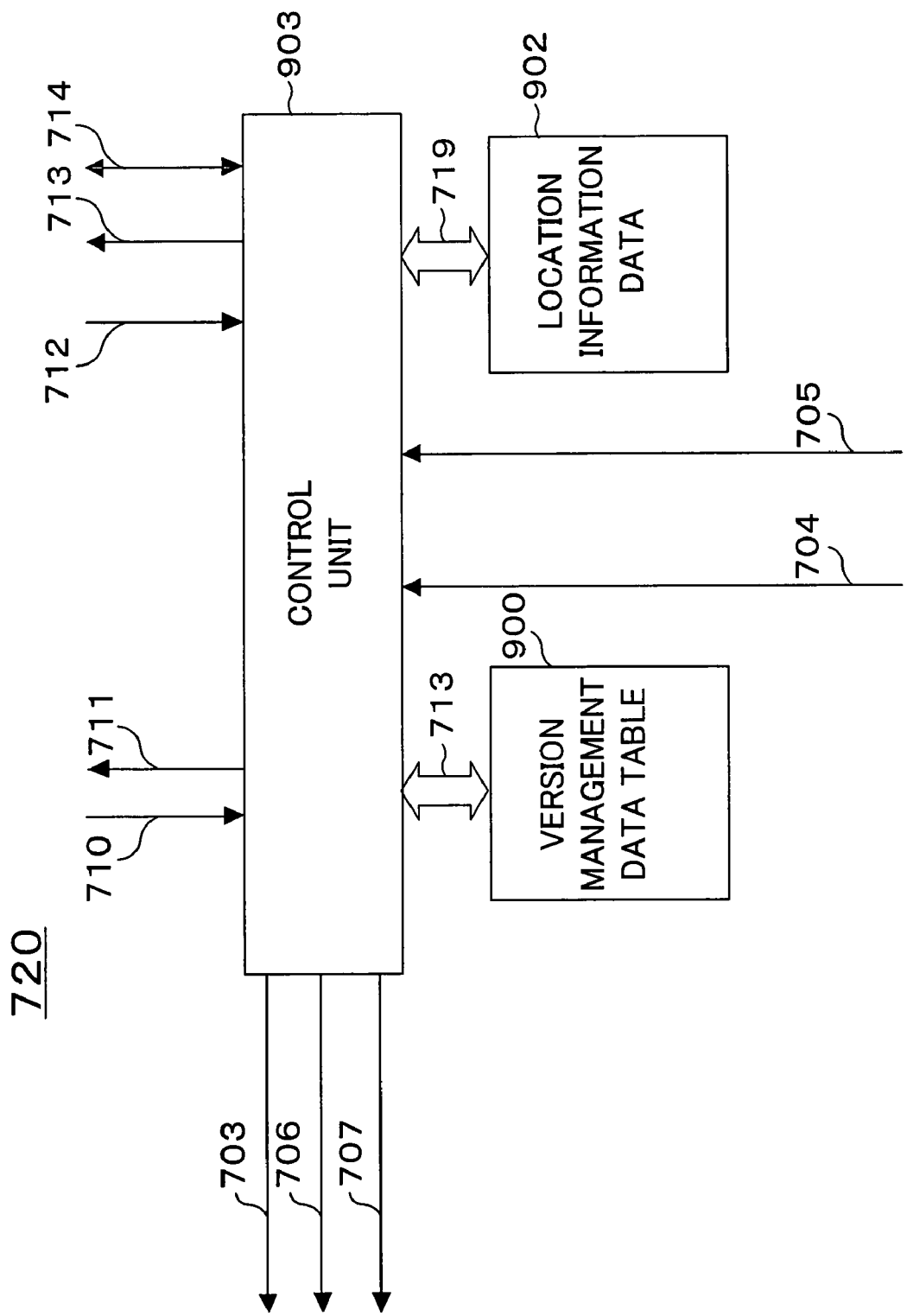
FIG. 24 is a block diagram illustrating the detailed configuration of a data correction unit shown in FIG. 23.

FIG. 24 illustrates the detailed configuration of the data correction unit 720 shown in FIG. 23. In FIG. 24, the data correction unit 720 includes a version management data table 900, a location information data table 902, and a control unit 903. The control unit 903, upon receiving the inputted IP version information 705, performs a predetermined process to generate the version management data table 900 through a data bus 713.

Figures 25, 26:
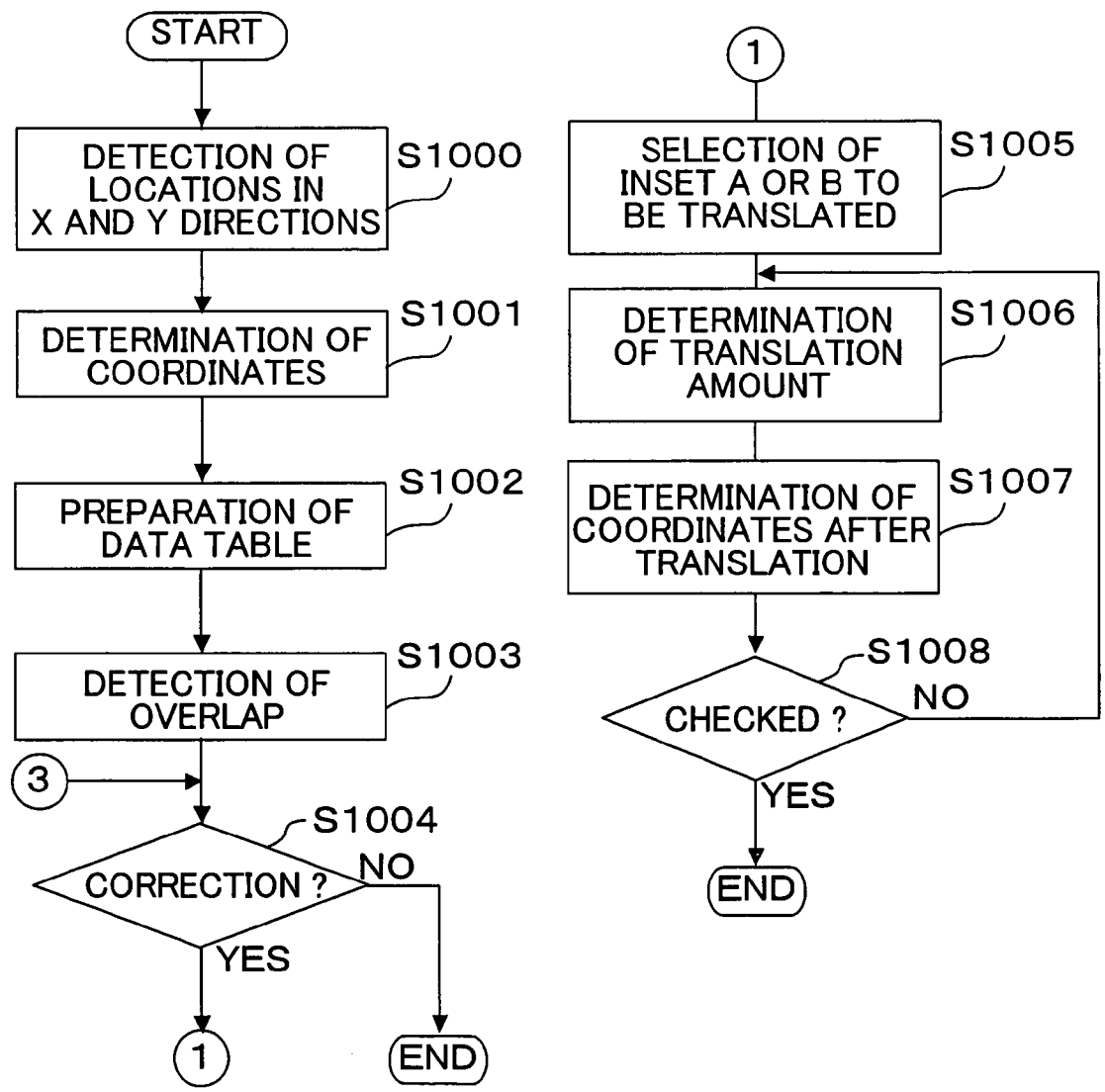
FIG. 25 illustrates an example of a version management data table shown in FIG. 24.
FIG. 26 is a flow chart showing process steps performed by a control unit illustrated in FIG. 24.

FIG. 25 illustrates an example of the version management data table 900 shown in FIG. 24. The data table 900 indicates relationship between management data for IPs and their versions. In the illustrated example, data in IP1 is in "Ver1 (version 1)", data in IP2 is in "Ver2 (version 2)", data in IP3 is in "Ver2 (version 2)", and data in IP4 is in Ver3 (version 3)".

The control unit 903 shown in FIG. 24 refers to the version management data table 900, and based on the version information 705 for the IP1, IP2, IP3 and IP4, checks whether the versions of the IPs are appropriate or not. Appropriateness of the IP versions is judged by, for example, calculating an average value AV of the IP versions and comparing the sizes of the value AV and an arbitrary value S. In this manner, appropriateness of the IP versions is judged. In the example shown in FIG. 25, AV=Ver 2 (version 2), while IP1 is in Ver 1 (version 1). Since Ver 1 is smaller than the value AV, the version of IP1 is judged to be old. The control unit 903 then provides the inquiry data 703 and the version indicating data 706 to the operator. In consideration of the provided data, the operator can make a further judgment whether the IP version is proper or not.

Further, at the time that the layout data 714 is inputted, the control unit 903 performs a predetermined process to generate the location information data table 902 through the data bus 719. Hereinafter, referring to the FIGS. 26 through 31, it will be described how the layout data 714 for the document to be generated is corrected. FIG. 28 illustrates an example of the layout data 714 before corrections which has been sent to the data correction unit 720 from the layout data unit 701 shown in FIG. 23. In this embodiment, a process for eliminating an overlap portion between an "inset 1" and an "inset 2" will be described.

FIG. 26 is a flow chart showing how the control unit 903 shown in FIG. 24 processes location information. In FIG. 26, in S1000, the layout data 714 is scanned for detection of the respective locations of the "inset 1" and the "inset 2" in the directions of X and Y. In S1001, based on the locations of the "inset 1" and the "inset 2" in the X and Y directions, coordinates thereof are calculated to determine coordinate positions A1, A2, A3, A4, B1, B2, B3 and B4. After the determinations of the coordinate positions, in S1002, the coordinate data is transferred from the control unit 903 to the location information data table 902 via the data bus 719 (see FIG. 29). In S1003, the control unit 903 detects an overlap portion between the "inset 1" and the "inset 2" in accordance with the location information data table 902. After the detection of the overlap portion, in S1004, in order to ask the operator whether or not to correct the layout data 714, the control unit 903 outputs the inquiry data 703 and the layout indicating data 707 to the operator and awaits the reply data 704 from the operator. The operator refers to the layout indicating data 707 to decide whether the layout data 714 should be corrected or not. In the case where the layout data 714 should be corrected, the operator provides the control unit 903 with the reply data 704 which indicates so. In the case where no correction should be made, the process is ended. Upon receiving the inputted reply data 704 indicating that the correction should be performed, the control unit 903 proceeds to the next process step S1005.

In S1005, the "inset 1" or the "inset 2" is selected to be translated, and when the selection has been completed, the process goes to the next step S1006. In S1006, the amount of translation is determined. As will be described subsequently, the translation amount, i.e., X direction=0 and Y direction=3, is determined from GA(X), GA(Y), GB(X), and GB(Y). The translation amount is then added to the position coordinates of the inset to be translated, thereby determining the coordinates thereof after the translation (see FIG. 30). In S1007, the layout data 714 is corrected (see FIG. 31), and the corrected layout is displayed for the operator using the layout indicating data 707. In S1008, the operator checks the layout indicating data 707 provided in S1007. If the layout is appropriate, the control unit 903 receives the reply data 704 indicating that the checking has been completed, after which the control unit 903 ends the process.

Figure 27:
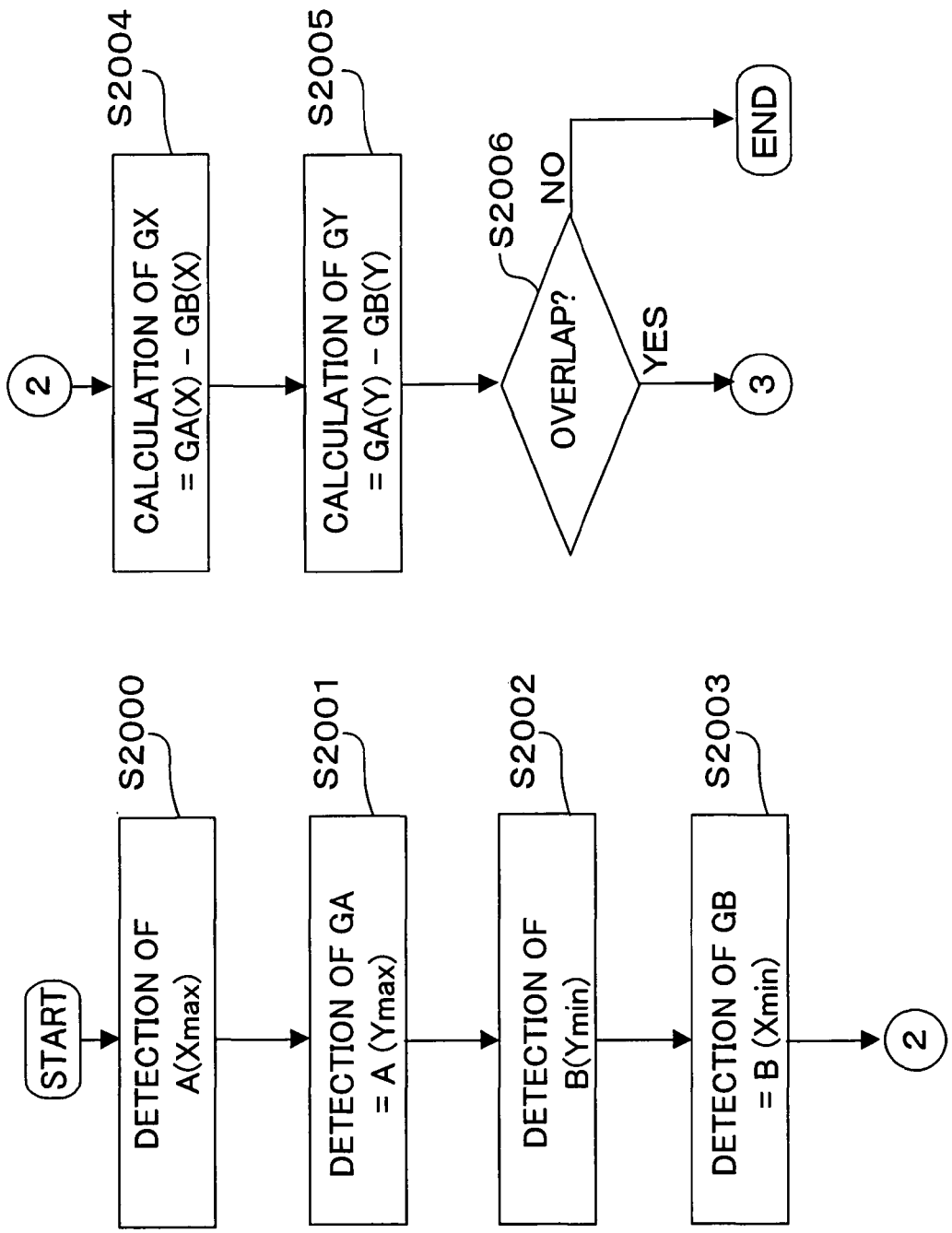
FIG. 27 is a flow chart illustrating the details of an overlap detection process shown in FIG. 26.
Figure 28:
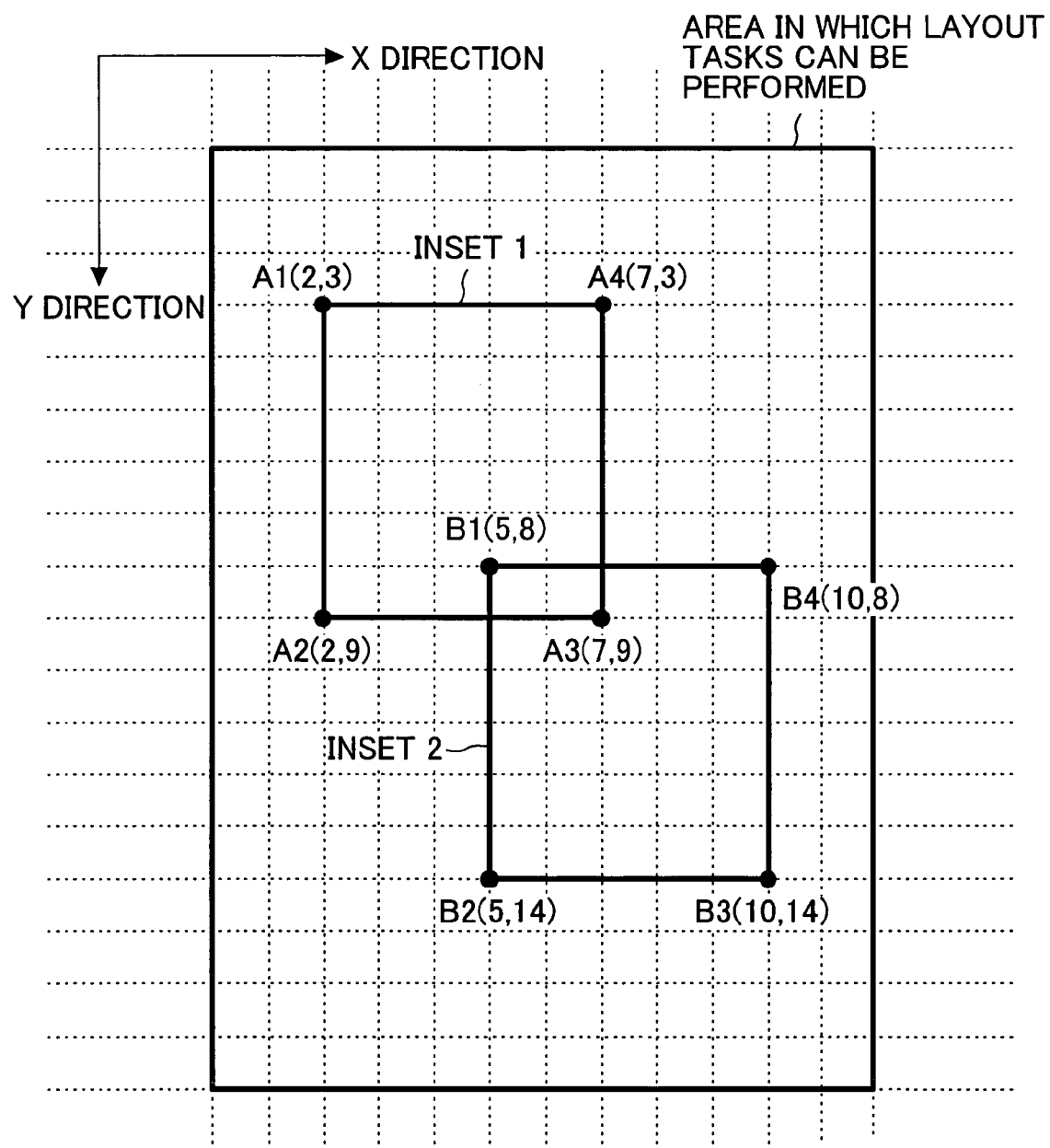
FIG. 28 illustrates an example of layout data before corrections which has been sent to the data correction unit from a layout data unit shown in FIG. 23.

FIG. 27 is a flow chart illustrating the details of the overlap-portion detection process step S1003 shown in FIG. 26. In FIG. 27, in S2000, among the coordinates A1, A2, A3 and A4 of the "inset 1", the largest value of X coordinate is detected, such that A3 (7, 9) and A4 (7, 3) are obtained. In S2001, the largest value of Y coordinate is detected from the coordinates that have been detected in S2000, such that GA (7, 9) is determined as a GA coordinate. In S2002, among the coordinates B1, B2, B3 and B4 of the "inset 2", the smallest value of Y coordinate is detected, such that B1 (5, 8) and B4 (10, 8) are obtained. In S2003, the smallest value of X coordinate is detected from the coordinates that have been detected in S2002, such that GB (5, 8) is determined as a GB coordinate. In 2004, the dimension of the overlap portion in the X direction is calculated by the equation GX=GA(X) −GB(X), thereby obtaining GX=2. In 2005, the dimension of the overlap portion in the Y direction is calculated by the equation GY=GA(Y)−GB(Y), thereby obtaining GY=1. In S2006, based on the calculation results GX=2 and GY=1 obtained in S2004 and S2005, whether the "inset 1" and the "inset 2" overlap with other is determined. The determination is made by comparing the respective values of GX and GY with the predetermined value S. Specifically, given that S=1, if GX≧1 or GY≧1, it is determined that the "inset 1" and the "inset 2" overlap with other. In this case, the process goes to S1004 shown in FIG. 26.

Figure 31:
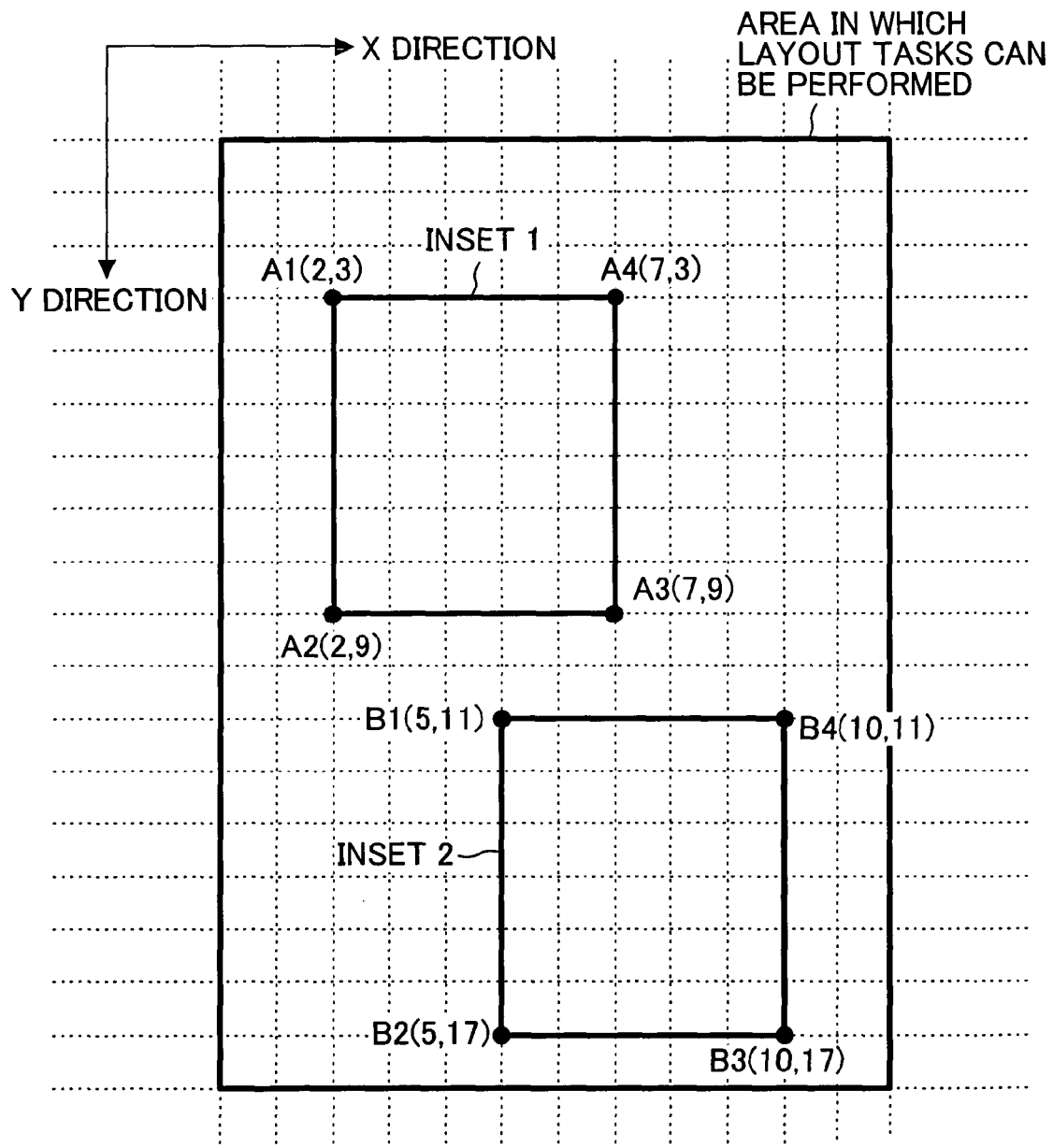
FIG. 31 illustrates layout data after corrections which corresponds to the location information data table shown in FIG. 30.

By performing the above described process steps, the overlap portion between the "inset 1" and the "inset 2" is eliminated in the corrected layout data 714 shown in FIG. 31.

As described above, in the third embodiment the data conversion and synthesis unit 702 that includes the data correction unit 720 is added to the configuration shown in FIG. 1, which prevents the operation manual 10, product specification 11, and LSI design data 12 from being generated from incorrect inputted data. Further, these data can be easily corrected, and a correction process, a troublesome process for an operator, can be performed in an automatic manner. Although in this embodiment the control unit 903 generates the version management data table 900 to determine whether IP versions are appropriate or not, the present invention is not limited thereto. The same effects are obtainable if a date data table is created using data on IPs' registration dates and such date data table is used to determine the appropriateness of the IPs.

What is claimed is:

1. An LSI development support system for generating design data and a document which are consistent with each other, the system comprising:
   a database which includes design data and document data for modules serving as LSI design assets, the design data and the document data being mutually related on a module-by-module basis,
   an input interface unit for inputting necessary information,
   a detailed-specific preparation temporary unit for preparing detailed-specific management information, which indicates the configuration of modules forming an LSI to be developed, and individual detailed specifics for each said module of the LSI, based on the information inputted in the input interface unit,
   a database selection unit for extracting, from the database, design data and document data for the modules specified in the detailed-specific management information, and
   a data conversion and synthesis unit for converting and synthesizing the extracted design data and document data based on the individual detailed specifics,
   wherein the document data includes LSI user's manual data.

2. The system of claim 1, wherein the database further includes detailed-specific templates which are associated with the module-by-module design data and document data, and
   the database selection unit also functions to extract, from the database, associated ones of the detailed-specific templates for the modules specified in the input interface unit and then transmit the extracted templates to the detailed-specific preparation temporary unit so that the individual detailed specifics can be prepared by filling in blanks in the detailed-specific templates.

3. The system of claim 2, wherein the database further includes management data for associating the module-by-module detailed-specific templates, design data and document data with each other.

4. The system of claim 1, wherein the document data includes product specification data.

5. The system of claim 1, wherein the data conversion and synthesis unit includes:
   a data conversion unit for converting the extracted document data into a data format with tags and
   a data synthesis unit for synthesizing the result of the conversion performed by the data conversion unit.

6. The system of claim 1, further comprising means for utilizing mutually related design data and document data other than a registered data in the database.

7. The system of claim 1, wherein the data conversion and synthesis unit further includes a data correction unit for correcting the results of the conversion or synthesis.

8. The system of claim 7, wherein the database further includes version data which is associated with the module-by-module design and document data, and
   the data correction unit includes means for determining, based on the version data, whether the conversion or synthesis results need to be corrected or not.

9. The system of claim 7, wherein the data correction unit includes means for correcting text data for a document to be generated before the text data is laid out.

10. The system of claim 7, wherein the data correction unit includes means for correcting data for a document to be generated after the data has been laid out.

* * * * *